United States Patent
Gross et al.

(10) Patent No.: US 10,483,210 B2
(45) Date of Patent: *Nov. 19, 2019

(54) GLASS ARTICLES WITH NON-PLANAR FEATURES AND ALKALI-FREE GLASS ELEMENTS

(71) Applicant: CORNING INCORPORATED, Corning, NY (US)

(72) Inventors: Timothy Michael Gross, Corning, NY (US); Paul John Shustack, Elmira, NY (US); Wendell Porter Weeks, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/523,759

(22) PCT Filed: Nov. 4, 2015

(86) PCT No.: PCT/US2015/058938
§ 371 (c)(1),
(2) Date: May 2, 2017

(87) PCT Pub. No.: WO2016/073549
PCT Pub. Date: May 12, 2016

(65) Prior Publication Data
US 2017/0338182 A1  Nov. 23, 2017

Related U.S. Application Data

(60) Provisional application No. 62/075,599, filed on Nov. 5, 2014.

(51) Int. Cl.
*H01L 23/538* (2006.01)
*H01L 51/52* (2006.01)
(Continued)

(52) U.S. Cl.
CPC ........ *H01L 23/5387* (2013.01); *B32B 17/064* (2013.01); *C03C 15/00* (2013.01);
(Continued)

(58) Field of Classification Search
CPC ... H01L 51/0097; H01L 51/56; H01L 51/524; H01L 51/5253; H01L 29/78603;
(Continued)

(56) References Cited

U.S. PATENT DOCUMENTS 6,092,392 A * 7/2000 Verlinden ............... G03C 1/765
65/148
7,201,965 B2 * 4/2007 Gulati ..................... B32B 17/06
428/1.1

(Continued)

FOREIGN PATENT DOCUMENTS

KR   2015001142 A   1/2015
WO   2014035942 A1  3/2014
(Continued)

OTHER PUBLICATIONS

Garner et al; "Ultra-Slim Flexible Glass for Roll-To-Roll Electronic Device Fabrication"; Appl. Phys. A (2014) 116: 403-407.
(Continued)

*Primary Examiner* — Sophia T Nguyen
(74) *Attorney, Agent, or Firm* — Jeffrey A. Schmidt

(57) ABSTRACT

An electronic device assembly includes a backplane having a glass composition substantially free of alkali ions, an elastic modulus of about 40 GPa to about 100 GPa, and a final thickness from about 20 μm to about 100 μm. The primary surfaces of the backplane are characterized by a prior material removal to the final thickness from an initial thickness that is at least 20 μm greater than the final thickness. The assembly also includes a protect layer on the first primary surface of the backplane; and a plurality of
(Continued)

US 10,483,210 B2

Page 2 electronic components on the second primary surface of the backplane. In addition, the backplane is configured with at least one static bend having a bend radius between about 25 mm and about 5 mm. The electronic components of the electronic device assembly can include at least one thin film transistor (TFT) element or organic light emitting diode (OLED) element.

19 Claims, 10 Drawing Sheets

(51) Int. Cl.
- H01L 23/15 (2006.01)
- H01L 29/786 (2006.01)
- H01L 51/56 (2006.01)
- B32B 17/06 (2006.01)
- C03C 15/00 (2006.01)
- C03C 17/00 (2006.01)
- C03C 17/32 (2006.01)
- H01L 51/00 (2006.01)

(52) U.S. Cl.
CPC .......... *C03C 17/007* (2013.01); *C03C 17/322* (2013.01); *C03C 17/326* (2013.01); *H01L 23/15* (2013.01); *H01L 29/78603* (2013.01); *H01L 51/0097* (2013.01); *H01L 51/524* (2013.01); *H01L 51/5253* (2013.01); *H01L 51/56* (2013.01); *B32B 2457/206* (2013.01); *C03C 2217/43* (2013.01); *C03C 2217/445* (2013.01); *C03C 2217/478* (2013.01); *H01L 2251/303* (2013.01); *H01L 2251/5338* (2013.01); *H01L 2251/558* (2013.01); *Y02E 10/549* (2013.01); *Y02P 70/521* (2015.11)

(58) Field of Classification Search
CPC ... H01L 21/786; H01L 23/15; H01L 27/1262; H01L 27/1218; B32B 2457/206
See application file for complete search history.

(56) References Cited

U.S. PATENT DOCUMENTS

| | | | | |
|---|---|---|---|---|
| 8,025,975 B2* | 9/2011 | Botelho | ................ | C03C 8/14 428/323 |
| 8,245,536 B2* | 8/2012 | Logunov | ................ | C03C 27/06 65/43 |
| 8,246,867 B2* | 8/2012 | Botelho | ................ | H01L 51/5246 264/1.7 |
| 8,440,479 B2* | 5/2013 | Nguyen | ................ | H01L 51/448 313/512 |
| 8,448,468 B2* | 5/2013 | Pastel | ................ | H01L 51/5246 65/155 |
| 8,563,113 B2* | 10/2013 | Edwards | ................ | B32B 27/32 428/221 |
| 8,609,229 B2* | 12/2013 | Kondo | ................ | B32B 17/10 428/212 |
| 8,907,871 B2* | 12/2014 | Orsley | ................ | G06F 3/044 345/173 |
| 9,321,677 B2* | 4/2016 | Chang | ................ | C03C 21/002 |
| 9,321,678 B2 | 4/2016 | Chang et al. | | |
| 10,221,090 B2 | 3/2019 | Murashige et al. | | |
| 2006/0038228 A1* | 2/2006 | Aitken | ................ | C03C 3/06 257/347 |
| 2006/0273304 A1* | 12/2006 | Cok | ................ | H01L 51/0096 257/40 |
| 2008/0128683 A1* | 6/2008 | Kim | ................ | H01L 51/5246 257/40 |
| 2008/0292856 A1* | 11/2008 | Garner | ................ | C03C 4/00 428/220 |
| 2009/0134786 A1* | 5/2009 | Matsuzaki | ............ | H01L 51/524 313/504 |
| 2010/0053721 A1* | 3/2010 | Chwu | ................ | G02F 1/133305 359/245 |
| 2011/0201490 A1* | 8/2011 | Barefoot | ................ | C03B 33/0222 501/66 |
| 2011/0241063 A1* | 10/2011 | Winscom | ............ | B32B 17/10009 257/99 |
| 2011/0281093 A1 | 11/2011 | Gulati et al. | | |
| 2012/0040146 A1 | 2/2012 | Garner et al. | | |
| 2012/0216570 A1* | 8/2012 | Abramov | ............... | C03C 21/002 65/30.14 |
| 2012/0223049 A1 | 9/2012 | Yoshikawa et al. | | |
| 2012/0263945 A1 | 10/2012 | Yoshikawa | | |
| 2012/0280368 A1* | 11/2012 | Garner | ............ | B32B 17/10018 257/629 |
| 2013/0017380 A1* | 1/2013 | Murata | ................... | C03B 25/08 428/215 |
| 2013/0109116 A1 | 5/2013 | Cavuoti et al. | | |
| 2013/0114219 A1* | 5/2013 | Garner | ................ | G02F 1/133308 361/750 |
| 2013/0175558 A1* | 7/2013 | Orsley | ................ | H01L 33/644 257/88 |
| 2013/0183454 A1* | 7/2013 | Nguyen | ................ | C03C 17/001 427/508 |
| 2013/0196163 A1* | 8/2013 | Swanson | ................ | B32B 17/061 428/426 |
| 2013/0273357 A1* | 10/2013 | Whitcomb | ............ | C03C 17/007 428/337 |
| 2014/0002385 A1* | 1/2014 | Ka | ........................ | G06F 1/1601 345/173 |
| 2014/0050911 A1* | 2/2014 | Mauro | ................... | C03C 3/087 428/220 |
| 2014/0151721 A1* | 6/2014 | Orsley | ................ | H01L 33/648 257/88 |
| 2014/0165654 A1* | 6/2014 | Bellman | ................ | C03B 35/14 65/32.1 |
| 2014/0170378 A1* | 6/2014 | Bellman | ................ | C03C 17/002 428/141 |
| 2014/0353625 A1* | 12/2014 | Yi | ........................ | H01L 51/5253 257/40 |
| 2015/0037554 A1* | 2/2015 | Gao | ........................ | C03C 17/22 428/217 |
| 2015/0048349 A1* | 2/2015 | Kawata | ............... | H01L 51/0097 257/40 |
| 2015/0093561 A1 | 4/2015 | Tokunaga et al. | | |
| 2015/0110990 A1* | 4/2015 | Chou | ..................... | B05D 3/067 428/76 |
| 2015/0210588 A1* | 7/2015 | Chang | ................... | C03C 21/002 361/750 |
| 2015/0210589 A1* | 7/2015 | Chang | ................... | C03C 21/002 428/220 |
| 2015/0210590 A1* | 7/2015 | Chang | ................... | C03C 21/002 428/220 |
| 2015/0225285 A1* | 8/2015 | Domey | ................... | C03C 17/34 428/201 |
| 2015/0263078 A1* | 9/2015 | Shieh | ................... | H01L 27/3244 438/23 |
| 2015/0263311 A1* | 9/2015 | Park | ................... | H01L 51/5256 257/40 |
| 2016/0002103 A1 | 1/2016 | Wang et al. | | |
| 2016/0028032 A1* | 1/2016 | Okada | ................ | H01L 51/0097 257/40 |
| 2016/0081180 A1* | 3/2016 | Huitema | ............ | H01L 51/0097 361/749 |
| 2016/0093685 A1* | 3/2016 | Kwon | ................ | H01L 27/3276 257/40 |
| 2016/0141551 A1* | 5/2016 | Seo | ..................... | H01L 51/5253 257/40 |
| 2016/0148984 A1* | 5/2016 | Kim | ..................... | H01L 51/0097 257/40 |
| 2016/0224069 A1* | 8/2016 | Chang | ................... | C03C 21/002 |
| 2016/0329386 A1* | 11/2016 | Sauers | ................ | H01L 27/3276 |
| 2016/0368815 A1* | 12/2016 | Hayashi | ............ | C03C 10/0036 |
| 2017/0113967 A1* | 4/2017 | Chapman | ............ | C03C 21/005 |
| 2017/0165950 A1* | 6/2017 | Leatherdale | ............ | B32B 7/12 |

(56) References Cited

U.S. PATENT DOCUMENTS

| | | | |
|---|---|---|---|
| 2017/0232701 A1* | 8/2017 | Keite-Telgenbuscher | ................... B32B 3/085 428/189 |
| 2017/0274627 A1* | 9/2017 | Chang | ................... B32B 17/064 |
| 2017/0309690 A1* | 10/2017 | Jang | ................... H01L 51/5281 |
| 2017/0338182 A1* | 11/2017 | Gross | ................... H01L 23/5387 |
| 2018/0006270 A1* | 1/2018 | Yi | ................... H01L 51/5293 |
| 2018/0009197 A1* | 1/2018 | Gross | ................... B32B 17/064 |
| 2018/0053451 A1* | 2/2018 | Han | ................... G06F 1/1652 |
| 2018/0108838 A1* | 4/2018 | Takayama | ................... H01L 29/6675 |
| 2018/0301660 A1* | 10/2018 | Liu | ................... H01L 51/5253 |

FOREIGN PATENT DOCUMENTS

| | | |
|---|---|---|
| WO | 2014139147 A1 | 9/2014 |
| WO | 2014166082 A1 | 10/2014 |

OTHER PUBLICATIONS

Hoehla et al; "Active Matrix Color-LCD on 75 µm Thick Flexible Glass Substrates"; Journal of Display Technology, vol. 8, No. 6, Jun. 2012; p. 309-316.

International Search Report and Written Opinion of the Internaitonal Searching Authority; PCT/US2015/058943, dated Jan. 18, 2016; 17 Pages; European Patent Office.

International Search Report of the Internaitonal Searching Authority; PCT/US2015/058938; dated Mar. 7, 2016; 6 Pages; European Patent Office.

English Translation of CN201580072386.X Office Action dated Mar. 22, 2019; 14 Pages; Chinese Patent Office.

* cited by examiner

GLASS ARTICLES WITH NON-PLANAR FEATURES AND ALKALI-FREE GLASS ELEMENTS

CROSS-REFERENCE TO RELATED APPLICATIONS

This application claims the benefit of priority under 35 U.S.C. § 371 of International Patent Application Serial No. PCT/US15/58938, filed on Nov. 4, 2015, which in turn, claims the benefit of priority of U.S. Provisional Patent Application Ser. No. 62/075,599 filed on Nov. 5, 2014, the contents of each of which are relied upon and incorporated herein by reference in their entireties.

TECHNICAL FIELD

The disclosure generally relates to glass articles, stack assemblies and electronic device assemblies having one or more static, non-planar features, and various methods for making them. More particularly, the disclosure relates to versions of these articles and assemblies containing alkali-free glass elements, along with methods for making them.

BACKGROUND

Flexible and curved versions of products and components that are traditionally rigid and/or planar in nature are being conceptualized for new applications. For example, flexible electronic devices can provide thin, lightweight and flexible properties that offer opportunities for new applications, for example curved displays and wearable devices. Many of these flexible electronic devices require flexible substrates for holding and mounting the electronic components of these devices. Polymeric foils have some advantages including resistance to fatigue failure, but suffer from marginal optical transparency, lack of thermal stability and limited hermeticity. When polymeric foils are employed as backplanes or substrates for electronic devices, their limited temperature resistance significantly limits processing and manufacturing of the electronic components employed in these devices.

Some of these electronic devices having static, non-planar features also can make use of flexible displays. For example, these static, non-planar features can constitute displays having beveled edges, curvature in the length direction of the device housing the display, curvature in the width direction of the device housing the display and other permutations of curved, bent or non-planar display features. Optical transparency and thermal stability are often important properties for flexible display applications. In addition, flexible displays with static, non-planar features should have high static fatigue and puncture resistance, including resistance to failure at small bend radii, particularly for flexible displays that have touch screen functionality with one or more surfaces having substantial curvature.

Conventional flexible glass materials offer many of the needed properties for substrate and/or display applications having one or more static, non-planar features. However, efforts to harness glass materials for these applications have been largely unsuccessful to date. Generally, glass substrates can be manufactured to very low thickness levels (<25 µm) to achieve smaller and smaller bend radii. However, these "thin" glass substrates suffer from limited puncture resistance. At the same time, thicker glass substrates (>150 µm) can be fabricated with better puncture resistance, but these substrates lack suitable static fatigue resistance and mechanical reliability upon bending into one or more static, non-planar shapes. In addition, some conventional glass substrate compositions have the disadvantage of containing relatively high alkali ion levels. Glass substrates made with these compositions are susceptible to alkali ion migration that can degrade the performance of the electronic devices and components mounted on these substrates.

Thus, there is a need for glass materials, components and assemblies for reliable use in backplane, substrate and/or display applications having one or more static, non-planar features, particularly for non-planar shaped electronic device applications.

SUMMARY

According to an aspect, an electronic device assembly is provided that includes a backplane having a glass composition substantially free of alkali ions, an elastic modulus of about 40 GPa to about 100 GPa, and a final thickness from about 20 µm to about 100 µm. The backplane also has a first primary surface, and a second primary surface. The primary surfaces are characterized by a prior material removal to the final thickness from an initial thickness that is at least 20 µm greater than the final thickness. The assembly also includes a protect layer on the first primary surface of the backplane; and a plurality of electronic components on the second primary surface of the backplane. In addition, the backplane is configured with at least one static bend having a bend radius between about 25 mm and about 5 mm. In some cases, the bend radius of the backplane can be set to between about 15 mm and about 5 mm. According to some implementations, the electronic components of the electronic device assembly comprise at least one thin film transistor (TFT) element or organic light emitting diode (OLED) element.

In certain aspects of the disclosure, the electronic device assembly further includes a cover over the plurality of electronic components, the cover having a thickness from about 25 µm to about 125 µm, a first primary surface, a second primary surface, and at least one static bend having a radius substantially equivalent to the bend radius of the backplane. The cover also includes a first glass layer having an optical transmissivity of at least 90%, and a first primary surface; and a compressive stress region extending from the first primary surface of the first glass layer to a first depth in the first glass layer, the region defined by a compressive stress of at least about 100 MPa at the first primary surface of the first glass layer. The cover is further characterized by: a puncture resistance of greater than about 1.5 kgf when the first primary surface of the cover is supported by (i) an approximately 25 µm thick pressure-sensitive adhesive having an elastic modulus of less than about 1 GPa and (ii) an approximately 50 µm thick polyethylene terephthalate layer having an elastic modulus of less than about 10 GPa, and the second primary surface of the cover is loaded with a stainless steel pin having a flat bottom with a 200 µm diameter; and a pencil hardness of greater than or equal to 8H.

According to an additional aspect, the electronic device assembly further includes a cover over the plurality of electronic components, the cover having a glass composition, and at least one curved feature having a radius substantially equivalent to the bend radius of the backplane. The cover is also characterized by an optical transmissivity of at least 90%; a puncture resistance of greater than about 1.5 kgf when the first primary surface of the cover is supported by (i) an approximately 25 µm thick pressure-sensitive adhesive having an elastic modulus of less than about 1 GPa and (ii)

an approximately 50 μm thick polyethylene terephthalate layer having an elastic modulus of less than about 10 GPa, and the second primary surface of the cover is loaded with a stainless steel pin having a flat bottom with a 200 μm diameter; and a pencil hardness of greater than or equal to 8H.

In certain aspects of the electronic device assembly of the disclosure, the assembly also includes an encapsulant that is located beneath the cover and joined to the backplane, the encapsulant configured to encapsulate the plurality of electronic components. Some implementations of the electronic device assembly include an encapsulant that is beneath the cover and joined to the backplane, the encapsulant configured to encapsulate the plurality of electronic components. In addition, the encapsulant has a thickness from about 25 μm to about 125 μm and further includes: (a) a second glass layer having an optical transmissivity of at least 90%, and a first primary surface; and (b) a compressive stress region extending from the first primary surface of the second glass layer to a first depth in the second glass layer, the region defined by a compressive stress of at least about 100 MPa at the first primary surface of the second glass layer. The encapsulant is further characterized by at least one curved feature having a radius substantially equivalent to the bend radius of the backplane.

In a further aspect of the disclosure, the electronic device assembly can further include an encapsulant located beneath the cover and joined to the backplane, the encapsulant further configured to encapsulate the plurality of electronic components; and a protect layer on the first primary surface of the encapsulant. In this aspect, the encapsulant is further characterized by: a glass composition substantially free of alkali ions and having an optical transmissivity of at least 90%; an elastic modulus of about 40 GPa to about 100 GPa; a final thickness from about 20 μm to about 100 μm; a first primary surface; and a second primary surface, the primary surfaces characterized by a prior material removal to the final thickness from an initial thickness that is at least 20 μm greater than the final thickness. The encapsulant is further characterized by at least one curved feature or static bend having a radius substantially equivalent to the bend radius of the backplane.

According to an additional aspect, a method of forming an electronic device assembly is provided that includes the steps: forming a backplane having a glass composition substantially free of alkali ions, an elastic modulus of about 40 GPa to about 100 GPa, an initial thickness that is at least 20 μm greater than a final thickness, a first primary surface, and a second primary surface; and removing material from the initial thickness of the backplane to define the final thickness, the final thickness from about 20 μm to about 100 μm. The method also includes the steps: forming a protect layer on the first primary surface of the backplane; disposing a plurality of electronic components on the second primary surface of the backplane; and forming at least one static bend in the backplane after the step of disposing the plurality of electronic components on the second primary surface of the backplane, the static bend having a bend radius between about 25 mm and about 5 mm.

In certain aspects of the method of forming the electronic device assembly, the method can further include the step: forming a cover over the plurality of electronic components, the cover having a thickness from about 25 μm to about 125 μm, a first primary surface, and a second primary surface. The cover also includes a first glass layer having an optical transmissivity of at least 90%, and a first primary surface; and a compressive stress region extending from the first primary surface of the first glass layer to a first depth in the first glass layer, the region defined by a compressive stress of at least about 100 MPa at the first primary surface of the first glass layer. The cover is also characterized by a puncture resistance of greater than about 1.5 kgf when the first primary surface of the cover is supported by (i) an approximately 25 μm thick pressure-sensitive adhesive having an elastic modulus of less than about 1 GPa and (ii) an approximately 50 μm thick polyethylene terephthalate layer having an elastic modulus of less than about 10 GPa, and the second primary surface of the cover is loaded with a stainless steel pin having a flat bottom with a 200 μm diameter; and a pencil hardness of greater than or equal to 8H. The method also includes the step of bending the cover to form at least one static bend having a radius substantially equivalent to the bend radius of the static bend in the backplane.

In certain aspects of the method of forming the electronic device assembly, the method includes the steps: sealing the backplane with an encapsulant; and encapsulating the plurality of electronic components with the encapsulant. According to some embodiments, the encapsulant includes a thickness from about 25 μm to about 125 μm; a second glass layer having an optical transmissivity of at least 90%, a first primary surface; and a second primary surface. The encapsulant also includes a compressive stress region extending from the first primary surface of the second glass layer to a first depth in the second glass layer, the region defined by a compressive stress of at least about 100 MPa at the first primary surface of the second glass layer; and at least one curved feature having a radius substantially equivalent to the bend radius of the static bend in the backplane. Certain aspects may include a step of bending the encapsulant to form the at least one curved feature before the step of sealing the encapsulant to the backplane. In another aspect of the foregoing method, the sealing step includes a step of frit sealing the encapsulant to the backplane.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiments, and together with the description serve to explain principles and operation of the various embodiments. Directional terms as used herein—for example, up, down, right, left, front, back, top, bottom—are made only with reference to the figures as drawn and are not intended to imply absolute orientation.

DETAILED DESCRIPTION

Figure 1:
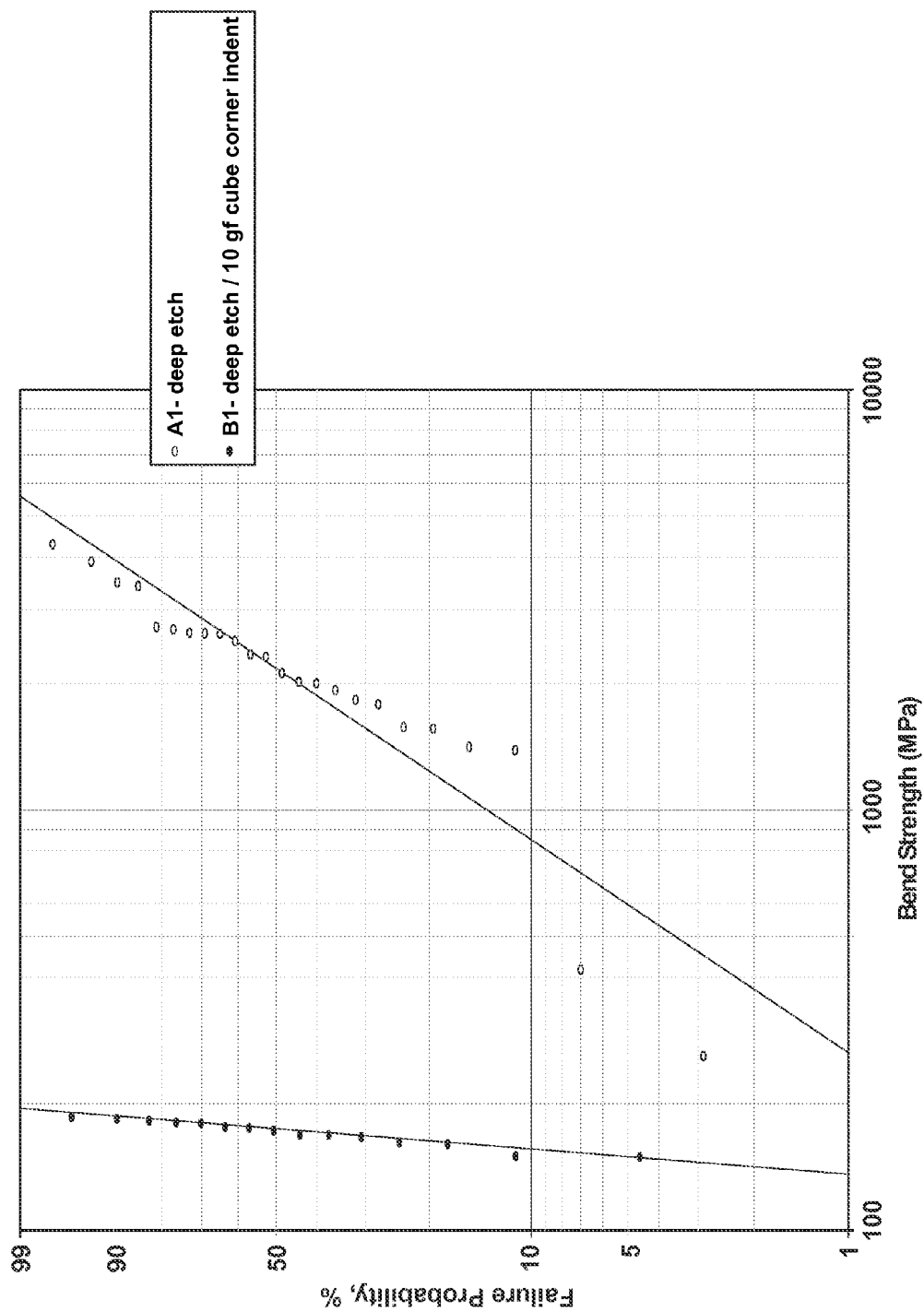
FIG. 1 is a Weibull plot of failure probability vs. load at failure for a group of flexible glass samples having etched and indented primary surfaces and another group of flexible glass samples having etched primary surfaces.

Reference will now be made in detail to the present preferred embodiments, examples of which are illustrated in the accompanying drawings. Whenever possible, the same reference numerals will be used throughout the drawings to refer to the same or like parts. Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Among other features and benefits, the stack assemblies, glass elements and glass articles (and the methods of making them) of the present disclosure provide mechanical reliability (e.g., in static tension and fatigue) at small bend radii. The small bend radii and reduced susceptibility to alkali ion migration are particularly beneficial when the stack assembly, glass element, and/or glass article, is/are used as a substrate or backplane component within a non-planar shaped display and/or a display having one or more static, non-planar features. For example, the element, assembly or article can be employed in a display in which a portion of the display has static, beveled edges or other static features having defined curvature. The flexibility of the articles in this disclosure allow these articles to be shaped during manufacturing to desired non-planar end shapes, while retaining their mechanical integrity and reliability within the application environment in that non-planar shape. More generally, the stack assemblies, glass elements and/or glass articles, may be used as one or more of: a cover on the user-facing portion of a foldable display, a location wherein puncture resistance is particularly important; a substrate, disposed internally within the device itself, on which electronic components are disposed; or elsewhere in a foldable display device, for example, as an encapsulant layer. Alternatively, the stack assembly, glass element, and or glass article, may be used in a device not having a display, but one wherein a glass layer is used for its beneficial properties and is configured with one or more static, non-planar features, in a similar manner as in the foregoing displays described with such features.

According to an aspect of the disclosure, a bendable stack assembly is provided that includes a glass element having a composition substantially free of alkali ions, an elastic modulus of about 40 GPa to about 100 GPa and a final thickness from about 20 µm to about 100 µm. The assembly also includes at least one protect layer over one or more primary surfaces of the glass element. The final thickness of the glass element is the thickness of the element after a material removal process, e.g., an etching process that removes at least 10 microns from each surface of the glass element. In addition, the glass element of the stack assembly has one or more static bends having a prescribed radius.

The ability of an alkali-free, bendable glass article to bend into a desired configuration without failure under static and/or cyclic conditions depends at least in part on the strength of the article. The strength of the article often depends on the size and distribution of the flaws in the articles relative to the stress field applied to the articles. During manufacturing, alkali-free glass substrates are cut, singulated or otherwise sectioned to final or near-final shapes. These processes, and the handling associated with them, often introduce flaws into the articles, degrading the strength and toughness of the articles. Consequently, alkali-free glass plates often demonstrate strength levels of 250 MPa or less. A fracture toughness ($K_{IC}$) value of about 0.8 MPa·m$^{1/2}$ is typical of alkali-free glass compositions. By employing Equation (1) below, it is possible to estimate a maximum flaw size of about 2.6 microns for such articles subjected to handling and manufacturing-related damage:

$$K_{IC} = Y * \sigma * a^{1/2} \quad (1)$$

where a is the maximum flaw size and Y is an empirically determined crack shape factor, about 1.12*π$^{1/2}$ for surface scratches typically associated with singulation and manufacturing-related handling damage to glass elements employed in display devices, for example.

Material removal processes, such as acid etch procedures performed after singulation, can significantly improve the flaw distributions within alkali-free glass articles (and other glass compositions) by reducing the density and size of the flaws. Other approaches employed by those skilled in the field can be employed to remove material from the glass (e.g., laser etching). According to an aspect of the disclosure, these material removal processes can enhance the strength of the alkali-free glass elements to strength levels of 1000 MPa or greater. In view of Equation (1), the material removal process reduces the maximum flaw size, a, to about 162 nm.

As handling and singulation can cause damage to the articles, it is also expected that minimal and even careful handling of alkali-free glass articles (and articles having other glass compositions) after the material removal processes can also significantly reduce the enhanced strength of the articles obtained through material removal procedures. FIG. 1 presents a Weibull plot of failure loads and failure probabilities that demonstrates this point. In particular, a group of non-strengthened, Corning Gorilla® glass articles subjected to a material removal process and small cube corner indentation (i.e., the "B1—deep etch" group) demonstrated significantly lower strength values compared to a group of samples having the same composition and material removal process conditions (i.e., the "A1—deep etch" group). In FIG. 1, the tested samples had an original thickness of about 200 microns and were reduced to 75 microns in thickness by a deep acid etching procedure. In the B1 group, the samples were subjected to a cube corner indentation at about 10 grams of force (gf).

Referring again to FIG. 1, the A1 group demonstrated strength values in excess of 1000 MPa at failure probabilities of 10% or greater. Further, two data points with strength values well below 1000 MPa were deemed to be outliers that were inadvertently damaged during testing-related handling. As a result, the Weibull modulus (i.e., the slope of failure probability vs. stress at failure) depicted in FIG. 1 for the A1 group is conservative in the sense that it also includes the two outliers. If the outliers are neglected from the group, the resulting Weibull modulus indicates that estimated strength values in excess of 1000 MPa are likely at failure probabilities of 2% or higher. In comparison, the B1 group of samples demonstrated strength values of 200 MPa or less for all failure probabilities. At a failure probability of 2%, the expected strength is about 150 MPa. It is expected that the data generated in FIG. 1 associated with the non-strengthened Corning Gorilla® glass samples will be comparable to strength data generated with alkali-free glass samples. While the strength values and Weibull moduli may differ slightly between a group of samples having an alkali-free glass composition and a non-strengthened Corning Gorilla® glass composition, the observed trend in the reduction in strength associated with the cube corner indentation depicted in FIG. 1 is expected to be substantially equivalent.

In view of these understandings, an aspect of the disclosure is to add a protect layer to one or more surfaces of the alkali-free glass element subject to tensile stresses from the development of static bends and/or curved features for the final application or product configuration. It is expected that the protect layer will ensure that the enhanced strength levels in the alkali-free glass elements are retained through additional handling and manufacturing, before installation of the glass elements in electronic devices or other articles. For example, a protect layer can be applied to the primary surface of an alkali-free glass element under tension from a permanent or semi-permanent bend and/or curvature applied or developed in the element during manufacturing as part of its final design. In some aspects, the protect layer is applied such that minimal contact is made to the surface of the alkali-free glass element to be protected. Thin, polymeric films of materials such as polymethyl methylacrylate (PMMA) at 100 microns or less in thickness can be adhered with an adhesive layer at 100 microns or less in thickness to a primary surface of the alkali-free glass element to give it protection. In certain embodiments, the protect layer can comprise a mixture of nano-silica particulate and epoxy or urethane materials at a thickness of about 5 microns to about 50 microns. Further, such a protect layer can be applied using any one or more of the following coating application techniques: dip, spray, roller, slot die, curtain, inkjet, offset printing, gravure, offset gravure, brush on, transfer printing, cast and cure, and other suitable processes as understood by those skilled in the operative field. Such mixtures can also be employed to protect edges of the alkali-free glass elements expected to experience tensile stresses from the static bends in the element associated with its final design configuration.

Figure 2:
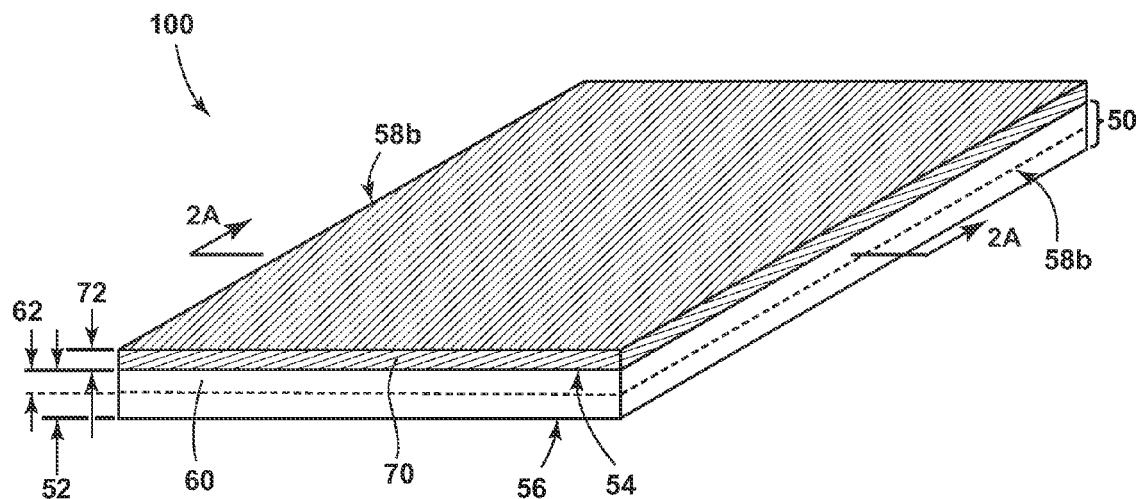
FIG. 2 is a perspective view of a bendable stack assembly comprising an alkali-free glass element having a composition substantially free of alkali ions and a protect layer according to an aspect of this disclosure.
Figure 2A:
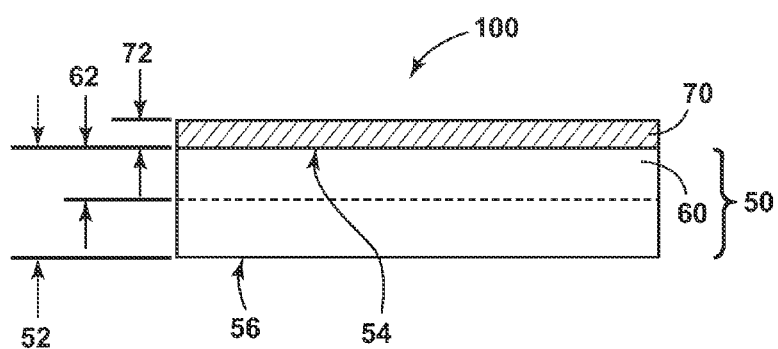
FIG. 2A is a cross-sectional view of the stack assembly depicted in FIG. 2.
Figure 2B:
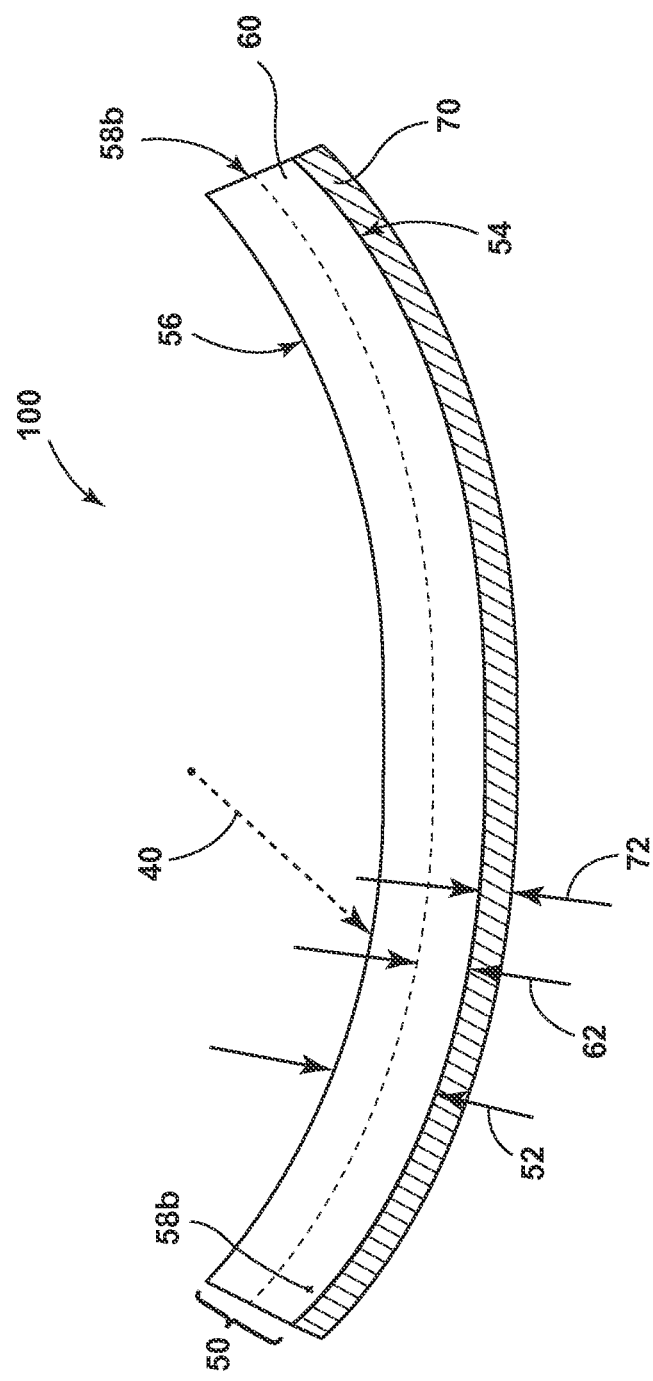
FIG. 2B is a cross-sectional view of the stack assembly depicted in FIG. 2, upon a bending of the assembly into a configuration having a static bend with a prescribed radius according to a further aspect of the disclosure.
Figure 2C:
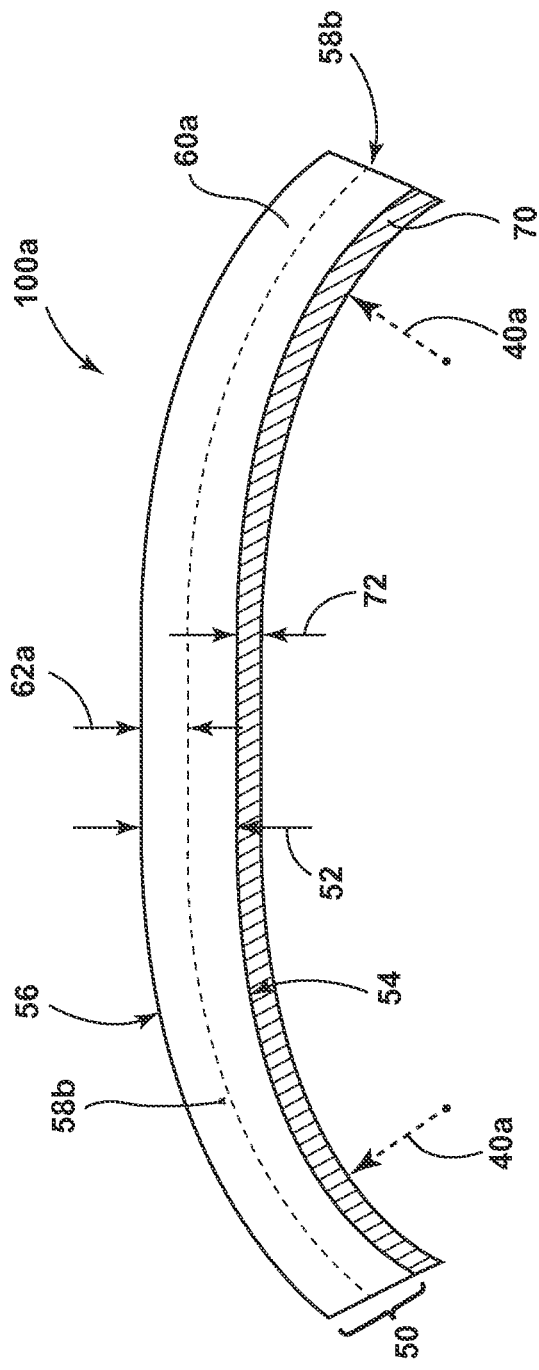
FIG. 2C is a cross-sectional view of the stack assembly depicted in FIG. 2, upon a bending of the assembly into a configuration having two static bends with prescribed radii according to an aspect of the disclosure.

Referring to FIGS. 2-2C, bendable stack assemblies 100, 100a are depicted according to one aspect of the disclosure. The assembly 100 includes a glass element 50 having a composition substantially free of alkali ions, an elastic modulus of about 40 GPa to about 100 GPa, a final thickness 52 from about 20 μm to about 100 μm, a first primary surface 54 and a second primary surface 56. In FIG. 2B, a static bend is applied to the bendable stack assembly 100 such that the first primary surface 54 is substantially in tension and the second primary surface 56 is substantially in compression. In FIG. 2C, two static bends are applied to the bendable stack assembly 100a such that the first primary surface 54 is substantially in compression and the second primary surface 56 is substantially in tension. In some aspects, one or more static bends are applied to the stack assemblies 100, 100a on one or more of the primary surfaces 54 and 56.

As depicted in FIGS. 2-2C, the primary surfaces 54, 56 are characterized by a prior material removal to the final thickness 52 from an initial thickness that is at least 20 μm greater than the final thickness 52. The glass element also includes a protect layer 70 having a thickness 72 on the first primary surface 54. In some additional aspects, the protect layer 70 is applied to the second primary surface 56 or on both primary surfaces 54, 56. In addition, the glass element 50 of the bendable stack assembly 100 is characterized by an absence of failure when the element 50 is subjected to a static bend at a bend radius 40 of about 100 mm or less, 75 mm or less, 50 mm or less, 25 mm or less, down to about 5 mm (see FIG. 2B). Likewise, the glass element 50 of the bendable stack assembly 100a is characterized by an absence of failure when the element 50 is subjected to one or more static bends at a bend radius of 40a of about 100 mm or less, 75 mm or less, 50 mm or less, 25 mm or less, and down to about 5 mm (see FIG. 2C). In some aspects, even smaller bend radii 40, 40a are feasible depending on the thickness and modulus of the glass element 50, along with the flaw distributions within the regions of the element under tension, among other considerations.

According to some aspects, the composition of the glass element 50 depicted in FIGS. 2-2C has less than 0.5 mol % of each of $Li_2O$, $Na_2O$, $K_2O$, $Rb_2O$ and $Cs_2O$. In certain implementations, the alkali-free nature of the glass element 50 is characterized by less than 0.45 mol %, 0.40 mol %, 0.35 mol %, 0.30 mol %, 0.25 mol %, 0.20 mol %, 0.15 mol %, 0.10 mol % or 0.05 mol % of each of $Li_2O$, $Na_2O$, $K_2O$, $Rb_2O$ and $Cs_2O$.

In some implementations, the bendable stack assembly 100, 100a depicted in FIGS. 2-2C includes a glass element 50 that is characterized by an absence of failure when the element 50 includes one or more static bends at a bend radius 40, 40a of about 15 mm at about 25° C. and about 50% relative humidity. In other aspects, the element 50 is characterized by an absence of failure when the element includes one or more static bends at a bend radius of 5 mm under the same or similar test conditions. The stack assemblies 100, 100 depicted in FIGS. 2-2C are also capable of the same or similar bending radii (e.g., within about +/−10% of the bending radii stated earlier) under other test conditions consistent with the expected application environment (e.g., humidity and/or temperature levels within about +/−10% of the values stated earlier).

Referring again to FIGS. 2-2C, the protect layer 70 of the bendable stackable assembly 100, 100a on the primary surface 54 of the glass element 50 (and/or on the second primary surface 56 in some aspects) can comprise various materials. Preferably, the protect layer 70 comprises a polymeric material having a thickness 72 of at least 5 microns. In some aspects, the thickness 72 of the protect layer 70 can range from 5 microns to 50 microns, depending on the thickness of the glass element 50. It is preferable to employ a protect layer 70 with a thickness 72 on the low end of the foregoing range for thinner glass elements to avoid warping of the element from shrinkage of the protect layer associated with its processing. As the thickness of the glass element is increased, according to some aspects, the thickness 72 of the protect layer 70 can also be increased within the foregoing range. Additionally, when the protect layer 70 will be on the surface of the glass element 50 that will be in tension in its shaped state, the protect layer 70 may be made so as to minimize its contribution to the tensile stresses in the glass element 50. For example, the thickness and/or modulus of the protect layer 70 are chosen so as to be smaller than those of the glass element 50.

The protect layer 70 can comprise nano-silica particulate and least one of epoxy and urethane materials. These compositions for the protect layer 70, and other suitable alternative compositions, are also disclosed in U.S. application Ser. No. 14/516,685, filed on Oct. 17, 2014. In one preferred example, a urethane having the following composition can be employed for the protect layer 70: 50% oligomer (Ebecryl® 8311: 40% 20 nm nanosilica dispersed in an aliphatic urethane acrylate), 43.8% monomer (Sartomer Arkema SR531: cyclic trimethylolpropane formal acrylate), 0.2% photoinitiator (MBF: methyl benzoylformate), 3.0% silane adhesion promoter (APTMS: 3-acryloxypropytrimethoxysilane), and 3.0% adhesion promoter (Sartomer Arkema CD9053: acrylate phosphate esters in TMPEOTA). In another preferred example, an epoxy having the following composition can be employed for the protect layer 70: 70.69% Nanopox® C-620 (cycloaliphatic epoxy resin with 40% by weight 20 nm spherical nanosilica), 23.56% Nanopox® C-680 (oxetane monomer with 50% by weight 20 nm spherical nanosilica), 3.00% Momentive™ CoatOSil® MP-200 (silane adhesion promoter), 2.50% Dow Chemical Cyracure UVI6976™ (cationic photoinitiator), and 0.25% Ciba™ Tinuvin® 292 (hindered amine light stabilizer). The protect layer 70 can also comprise a polymeric layer, film or sheet bonded to the surface of the glass element 50 by an adhesive layer having the same or a similar thickness.

The bendable stack assembly 100 depicted in FIGS. 2-2B can be configured with a glass element 50 having a flaw distribution indicative of enhanced strength values. In certain implementations, the first primary surface 54 and a region 60 between the first primary surface 54 and about half of the final thickness 62 defines a substantially flaw-free region having a flaw distribution characterized by a plurality of flaws having an average longest cross-sectional dimension of about 200 nm or less. In some aspects, the substantially flaw-free region 60 can span to various depths (e.g., from ⅓ to ⅔ of the thickness 52 of the glass element 50) within the element 50, depending on the processing conditions used to create the reduced flaw sizes within the region 60. According to some embodiments, the substantially flaw-free region 60 is located in regions of the glass element 50 subjected to tensile stresses associated with one more static bends at a bend radius 40 (e.g., a static bend on the first primary surface 54 that places it in tension). The enhanced strength in the region 60 can offset the higher tensile stresses in the region associated with the inclusion of one or more static bends.

Similarly, the bendable stack assembly 100a depicted in FIG. 2C can be configured with a glass element 50 having a flaw distribution indicative of enhanced strength values. In certain implementations, the second primary surface 56 and a region 60a between the second primary surface 56 and about half of the final thickness 62a defines a substantially flaw-free region having a flaw distribution characterized by a plurality of flaws having an average longest cross-sectional dimension of about 200 nm or less. In some aspects, the substantially flaw-free region 60a can span to various depths (e.g., from ⅓ to ⅔ of the thickness 52 of the glass element 50) within the element 50, depending on the processing conditions used to create the reduced flaw sizes within the region 60a. According to some embodiments, the substantially flaw-free region 60a is located in regions of the glass element 50 subjected to tensile stresses associated with one more static bends at a bend radius 40a (e.g., a static bend on the second primary surface 56 that places it in tension). The enhanced strength in the region 60a can offset the higher tensile stresses in the region associated with the inclusion of one or more static bends.

According to other aspects of the disclosure, the bendable stack assembly 100, 100a depicted in FIGS. 2-2C can include a glass element 50 that has been formed with a fusion process and the elastic modulus of the element is between about 40 GPa to about 65 GPa. Accordingly, the glass element 50 can include a fusion line (not shown). In certain aspects, the glass element 50 can be characterized by a fictive temperature between 700° C. and 800° C. at a viscosity of about $10^{10}$ Pa·s, preferably prepared using a fusion process. These fictive temperatures are generally higher than the fictive temperatures of most alkali-free glass compositions and result in lower elastic modulus values compared to compositions that are prepared using float processes and are annealed. Alkali-free glass compositions that are prepared by float processes are less desirable as they often have a higher elastic modulus compared to glass elements prepared using a fusion process.

In another implementation of the bendable stack assembly 100, 100a depicted in FIGS. 2-2C, the assembly includes a glass element 50 having a composition substantially free of alkali ions, an elastic modulus of about 40 GPa to about 100 GPa, a $K_{IC}$ fracture toughness of at least 0.6 MPa·m$^{1/2}$, and a thickness 52 from about 20 μm to about 100 μm. With regard to the assembly 100, the glass element 50 also includes a first primary surface 54 substantially in tension and a second primary surface 56 substantially in compression upon the inclusion of a static bend at a radius 40 (see FIG. 2B). With regard to the assembly 100a (see FIG. 2C), the glass element 50 also includes a second primary surface 56 substantially in tension and a first primary surface 54 substantially in compression upon the inclusion of one or more static bends at a radius 40a. The glass element 50 of assembly 100, 100a also includes a protect layer 70 on the first primary surface 54.

In certain aspects of the bendable stack assembly 100, 100a, depicted in FIGS. 2-2C, the assembly can be configured with a glass element 50 having a composition substantially free of alkali ions, an elastic modulus of about 40 GPa to about 100 GPa, a final thickness 52 from about 20 μm to about 100 μm, and a bend strength of at least 1000 MPa at a failure probability of 2% or greater. The glass element 50 also includes a first primary surface 54 substantially in tension or compression, and a second primary surface 56 substantially in compression or tension upon the inclusion of one or more static bends at a bend radius 40, 40*a* on these primary surfaces. In this configuration, the primary surfaces 54, 56 are characterized by a prior material removal to the final thickness 52 from an initial thickness that is at least 20 μm greater than the final thickness. The glass element 50 also includes a protect layer 70 on the first primary surface 54. In addition, the glass element is characterized by a retained strength of at least 90% of the bend strength after the assembly 100, 100*a* has been subjected to an indentation in the portion of the protect layer 70 laminated to the first primary surface 54 by a cube corner indenter at 10 gf.

Figure 3:
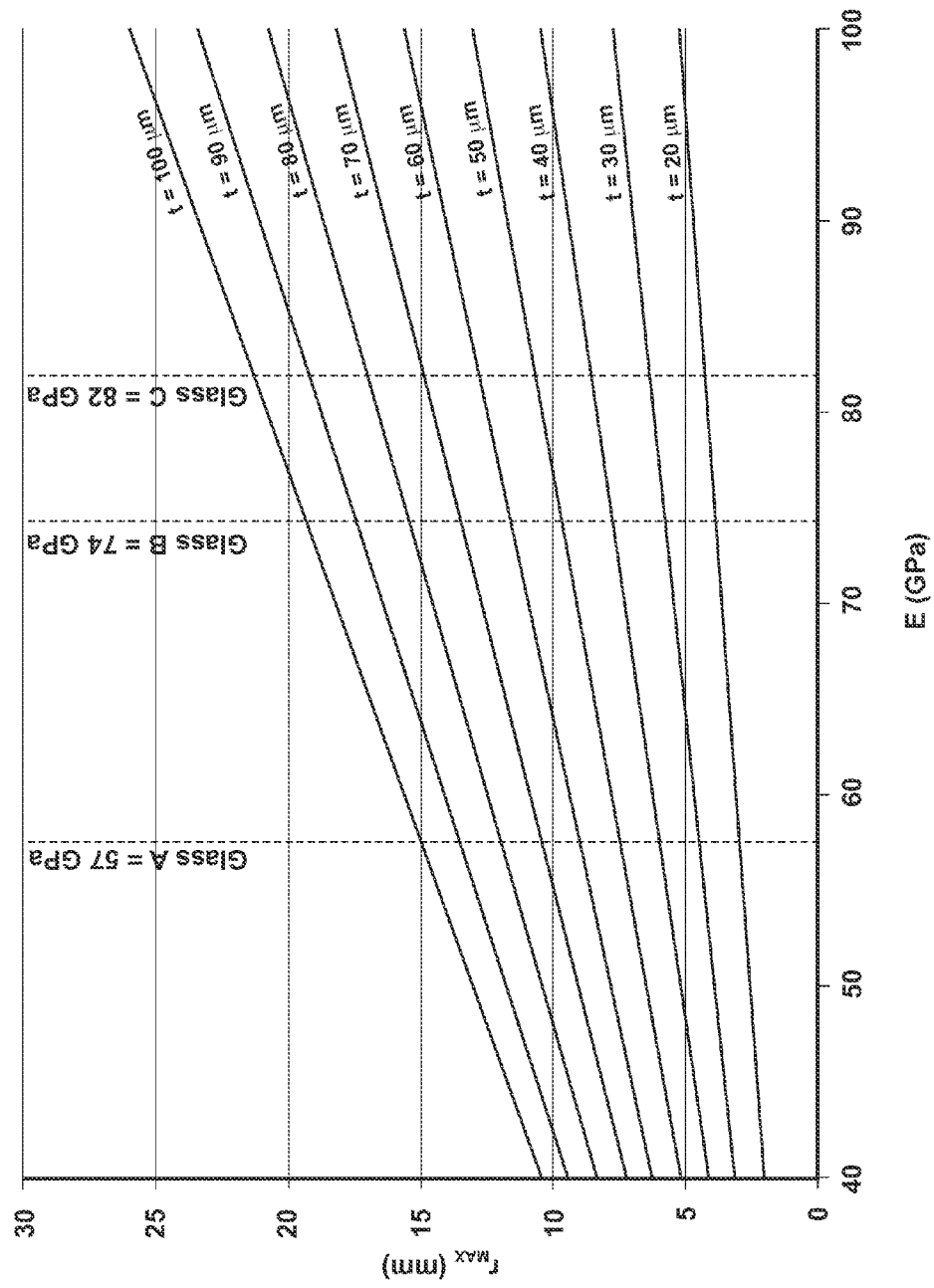
FIGS. 3 and 3A are schematics depicting design configurations for bendable stack assemblies with particular regard to the maximum bend radii, elastic modulus and thickness of the alkali-free glass element employed in these assemblies according to further aspects of the disclosure.

As demonstrated by FIG. 3, bendable stack assemblies 100, 100*a* having alkali-free glass elements of various thicknesses and elastic moduli can be employed to achieve bend radii 40, 40*a* of 25 mm or less according to aspects of the disclosure. With expected strength levels of 1000 MPa or greater, fatigue failure resistance (e.g., cyclic and/or static fatigue) for estimated 10-year lifetimes can be obtained by maintaining tensile stresses at or below ⅕ the maximum strength value. Accordingly, static bend radii that produce stress levels of 200 MPa or less should not be susceptible to static fatigue-related failure in the alkali-free glass elements. More specifically, Equation (2) below was used to generate the solution space depicted in FIG. 3, assuming a maximum induced tensile stress, $\sigma_{max}$, of 200 MPa for the glass element employed in the stack assemblies 100, 100*a*:

$$R=(E*h)/(1-v^2)*2\sigma_{max} \qquad (2)$$

where R=maximum bend radii of the stack assembly without fatigue-related failure, h is the thickness of the glass element, E is the elastic modulus of the glass element and v is the Poisson's ratio for the alkali-free glass (assumed to be 0.2).

Referring to FIG. 3, it is evident that a bendable stack assembly 100, 100*a* configured with a glass element 50 having an elastic modulus of about 82 GPA ("Glass C") and a thickness of about 100 microns is capable of maximum static bend radii 40, 40*a* of about 22 mm. Decreasing the thickness to 20 microns, for example, improves the maximum bend radii to about 4 mm (i.e., a sharper bend is feasible). Similarly, a bendable stack assembly 100, 100*a* configured with a glass element 50 having a lower elastic modulus of about 74 GPA ("Glass B") and a thickness of about 100 microns is capable of maximum bend radii 40, 40*a* of about 18 mm. Decreasing the thickness to 20 microns, for example, improves the maximum bend radii to below 4 mm. Further, a bendable stack assembly 100, 100*a* configured with a glass element 50 having an elastic modulus of about 57 GPA ("Glass A") and a thickness of about 100 microns is capable of maximum bend radii 40, 40*a* of about 15 mm. Decreasing the thickness to 20 microns, for example, improves the maximum bend radii to about 3 mm.

Figure 3A:
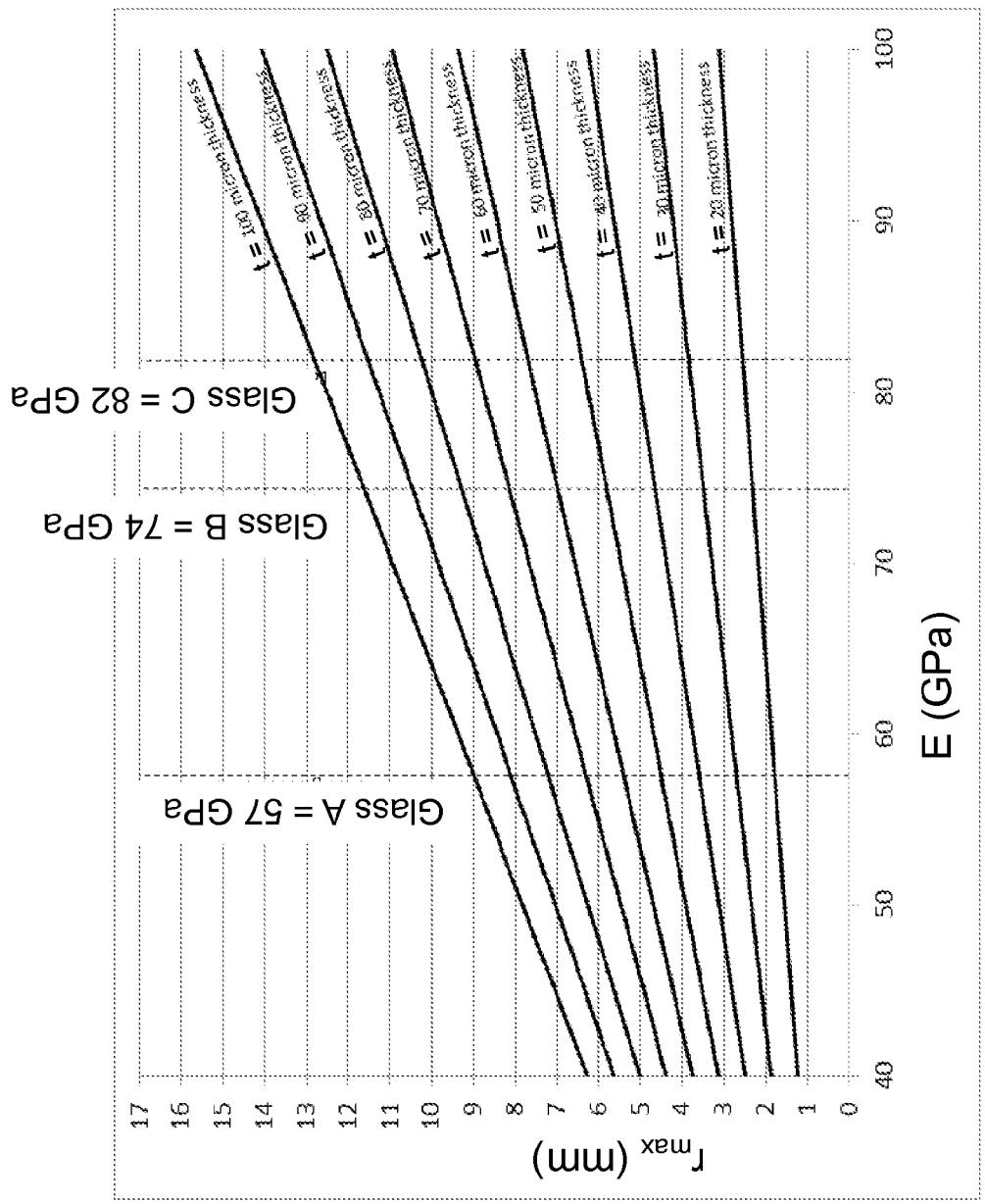

As demonstrated by FIG. 3A, bendable stack assemblies 100, 100*a* having alkali-free glass elements of various thicknesses and elastic moduli can be employed to achieve bend radii 40, 40*a* of 25 mm or less according to aspects of the disclosure. With expected strength levels of 1000 MPa or greater, fatigue failure resistance (e.g., cyclic and/or static fatigue) for estimated 10-year lifetimes can be obtained by maintaining tensile stresses at or below ⅓ the maximum strength value. Accordingly, static bend radii that produce stress levels of 333 MPa or less should not be susceptible to static fatigue-related failure in the alkali-free glass elements. More specifically, Equation (2) below was used to generate the solution space depicted in FIG. 3A, assuming a maximum induced tensile stress, $\sigma_{max}$, of 333 MPa for the glass element employed in the stack assemblies 100, 100*a*:

$$R=(E*h)/(1-v^2)*2\sigma_{max} \qquad (2)$$

where R=maximum bend radii of the stack assembly without fatigue-related failure, h is the thickness of the glass element, E is the elastic modulus of the glass element and v is the Poisson's ratio for the alkali-free glass (assumed to be 0.2).

Referring to FIG. 3A, it is evident that a bendable stack assembly 100, 100*a* configured with a glass element 50 having an elastic modulus of about 82 GPA ("Glass C") and a thickness of about 100 microns is capable of maximum static bend radii 40, 40*a* of about 13 mm. Decreasing the thickness to 20 microns, for example, improves the maximum bend radii to about 2.5 mm (i.e., a sharper bend is feasible). Similarly, a bendable stack assembly 100, 100*a* configured with a glass element 50 having a lower elastic modulus of about 74 GPA ("Glass B") and a thickness of about 100 microns is capable of maximum bend radii 40, 40*a* of about 11.5 mm. Decreasing the thickness to 20 microns, for example, improves the maximum bend radii to below 2.5 mm. Further, a bendable stack assembly 100, 100*a* configured with a glass element 50 having an elastic modulus of about 57 GPA ("Glass A") and a thickness of about 100 microns is capable of maximum bend radii 40, 40*a* of about 9 mm. Decreasing the thickness to 20 microns, for example, improves the maximum bend radii to less than 2 mm.

Figure 4:
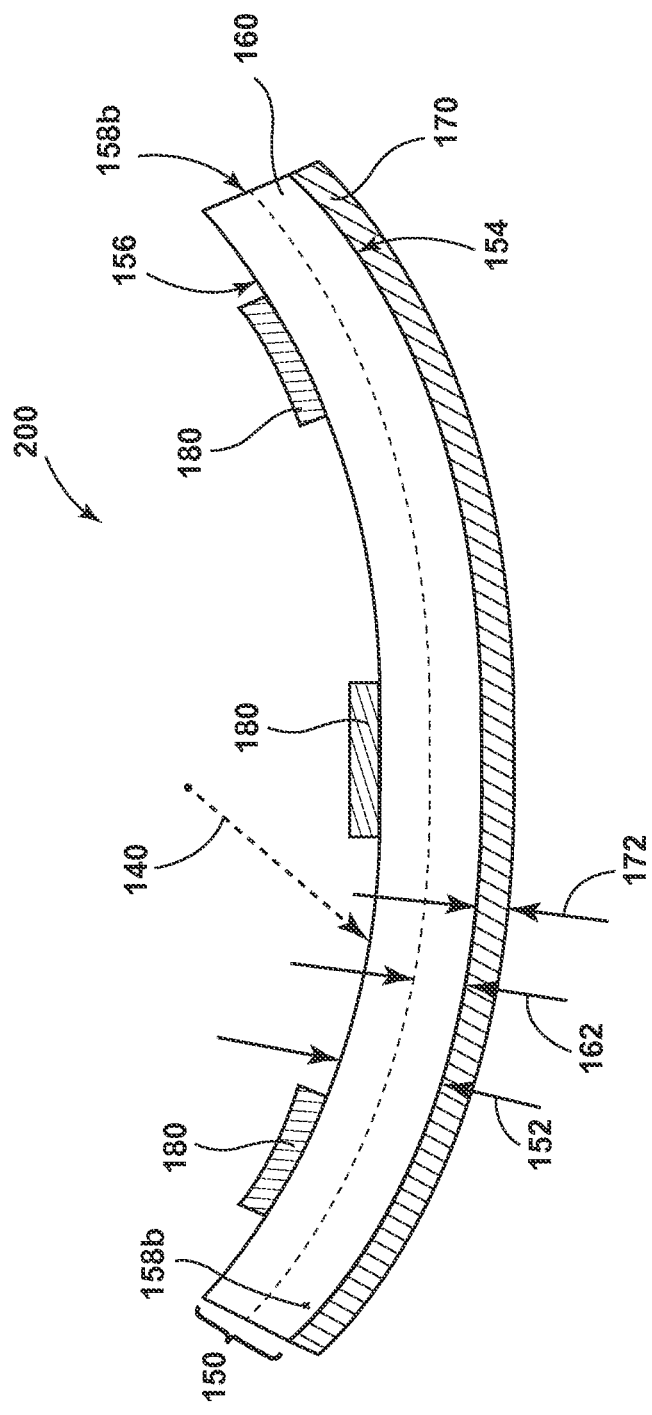
FIG. 4 is a cross-sectional view of an electronic device assembly according to an additional aspect of the disclosure that includes a backplane having an alkali-free glass composition, a protect layer, electronic devices on the backplane and a static bend of the backplane putting the surface containing the electronic devices in compression.
Figure 4A:
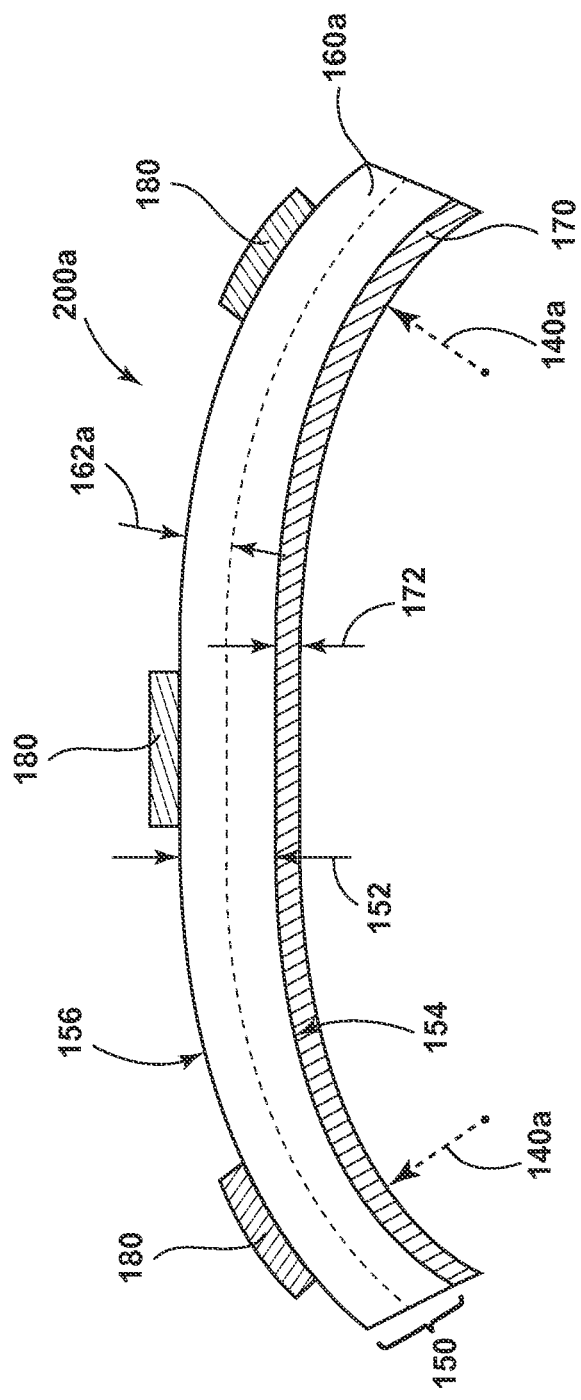
FIG. 4A is a cross-sectional view of an electronic device assembly according to an aspect of the disclosure that includes a backplane having an alkali-free glass composition, a protect layer, electronic devices on the backplane and two static bends of the backplane putting the surface containing the electronic devices in tension.

Referring to FIGS. 4-4A, electronic device assembly 200, 200*a* is provided that includes a backplane 150 having a glass composition substantially free of alkali ions, an elastic modulus of about 40 GPa to about 100 GPa, and a final thickness 152 from about 20 μm to about 100 μm. The backplane 150 has a first primary surface 154 and a second primary surface 156. Further, the primary surfaces 154, 156 are characterized by a prior material removal to the final thickness 152 from an initial thickness that is at least 20 μm greater than the final thickness 152. The assembly 200, 200*a* also includes a protect layer 170 on the first primary surface 154 of the backplane 150; and a plurality of electronic components 180 on the second primary surface 156 of the backplane 150. In addition, the backplane 150 of assembly 100 (see FIG. 4) is configured with at least one static bend or curved feature at a bend radius 140 of about 25 mm to about 5 mm. Similarly, the backplane 150 of the assembly 100*a* (see FIG. 4A) is configured with at least one static bend at a bend radius 140*a* of about 25 mm to about 5 mm. In some aspects of assembly 200, 200*a*, the backplane 150 is configured with at least one static bend or curved feature at a bend radius 140, 140*a* of about 15 mm to about 5 mm.

As depicted in FIG. 4, the electronic device assembly 200 can include a static bend at a bend radius 140 such that the first primary surface 154 is placed in tension and the second primary surface 156 containing the electronic components 180 is in compression. Consequently, the protect layer 170 can be placed over the primary surface 154 in tension to ensure that handling-related defects do not develop in that surface that could lead to a strength reduction and, ultimately, a reduction in static fatigue life performance for a given bend radius 140. In some aspects of the device assembly 200, a substantially flaw-free region 160 having a depth 162 is configured within the backplane 150. The existence of the flaw-free region 160 in the backplane 150 can counteract (e.g., by virtue of increasing the strength and fracture toughness of the backplane 150) tensile stresses in the backplane along the first primary surface 154 associated with the static bend at a bend radius 140. The substantially flaw-free region 160 is comparable in all respects to the flaw-free region 60 outlined earlier in connection with the assembly 100 (see FIGS. 2-2B and corresponding description).

As depicted in FIG. 4A, the electronic device assembly 200a can include a static bend at a bend radius 140a such that the second primary surface 156 containing the electronic components 180 is in tension. In this aspect, however, a protect layer 170 can be placed over the first primary surface 154 (in compression) to ensure that handling-related defects on that side of the element 150 do not develop in that surface that could lead to a premature failure. In some aspects (not shown), the protect layer 170 can be placed over the second primary surface 156 (i.e., the surface containing the electronic components 180) in tension to ensure that handling-related defects do not develop in that surface that could lead to a strength reduction and, ultimately, a reduction in static fatigue life performance for a given bend radius 140a. In this aspect, the composition of the protect layer 170 may be selected in part to ensure that it has high temperature capability sufficient to withstand the manufacturing processes associated with development and/or attaching the electronic components 180 to the second primary surface 156. In some aspects of the device assembly 200a, a substantially flaw-free region 160a having a depth 162a is configured within the backplane 150. The existence of the flaw-free region 160 in the backplane 150 can counteract (e.g., by virtue of increasing the strength and fracture toughness of the backplane 150) tensile stresses in the backplane along the second primary surface 156 associated with one or more static bends at a bend radius 140a. The substantially flaw-free region 160a is comparable in all respects to the flaw-free region 60a outlined earlier in connection with the assembly 100a (see FIGS. 2-2C and corresponding description).

With regard to the electronic device assembly 200, 200a depicted in FIGS. 4-4A, the backplane 150, substantially flaw-free region 160, 160a, and protect layer 170 components of the electronic assembly are comparable to the glass element 50, substantially flaw-free region 60, 60a and protect layer 70, respectively, employed in the stack assembly 100, 100a depicted in FIGS. 2-2C. As such, the earlier-described variants of the stack assembly 100, 100a are also applicable to the electronic device assembly 200, 200a.

In some aspects, the electronic components 180 of the electronic device assembly 200, 200a comprise at least one thin film transistor (TFT) element or at least one organic light-emitting diode (OLED) element. When temperature-resistant protect layer 170 compositions are employed in the device assemblies 200, 200a, high-temperature processing of the electronic components 180 on the backplane 150 can be employed (e.g., as compared to systems having a polymer backplane). Advantageously, the increased temperature capability of device assemblies 200, 200a (e.g., as compared to conventional systems solely relying upon flexible, polymeric components) can be used to realize higher manufacturing yields and/or the integration of higher performance electronic device components into the device housing the backplane.

Figure 5:
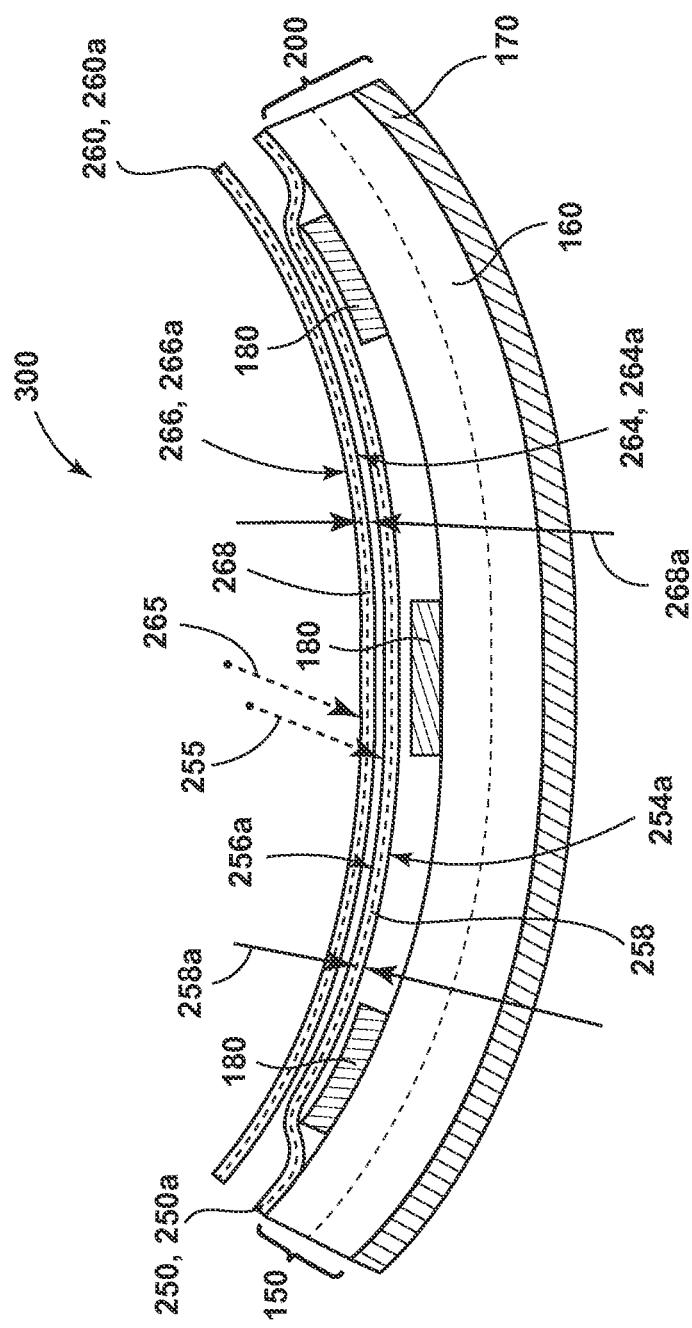
FIG. 5 is a cross-sectional view of an electronic device assembly incorporating the electronic device assembly depicted in FIG. 4, along with an encapsulant and a cover possessing a static bend that is substantially equivalent to the static bend of the backplane of the assembly depicted in FIG. 4.
Figure 5A:
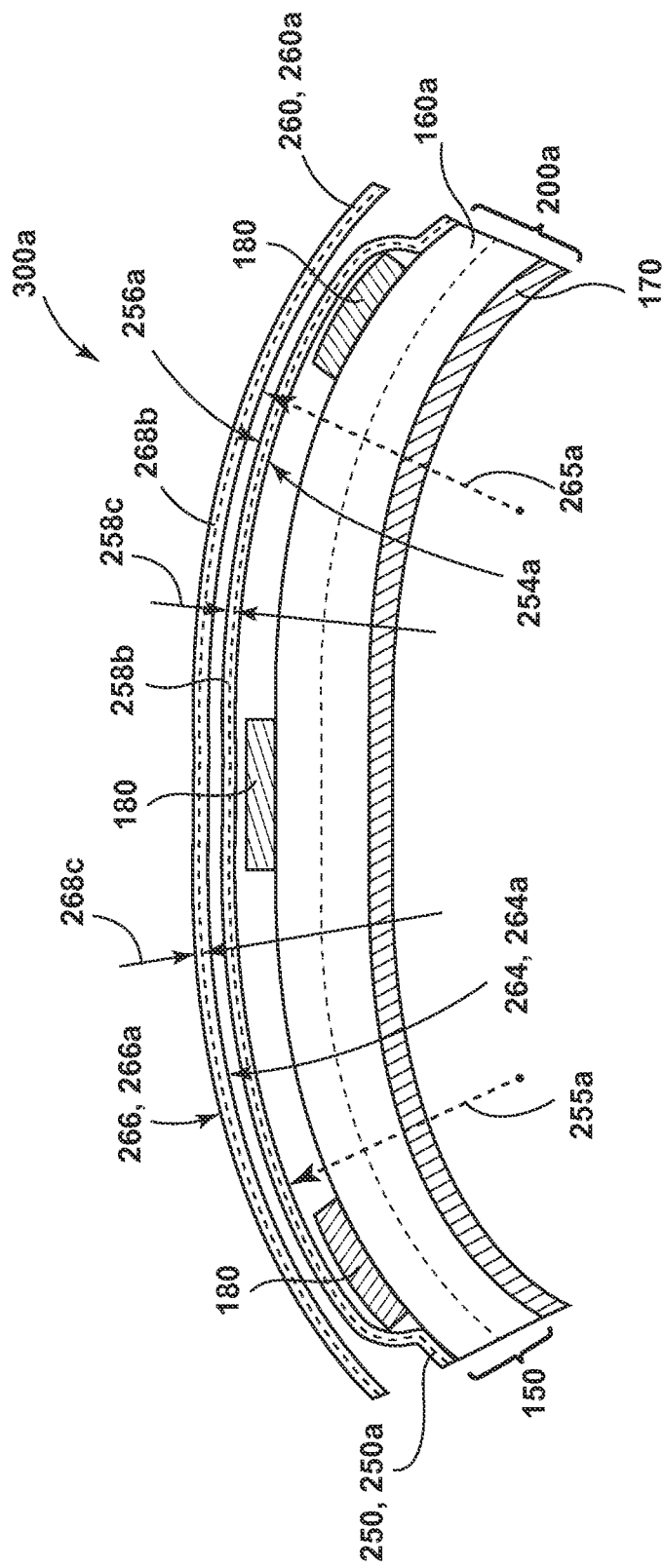
FIG. 5A is a cross-sectional view of an electronic device assembly incorporating the electronic device assembly depicted in FIG. 4A, along with an encapsulant and a cover possessing static bends that are substantially equivalent to the static bends of the backplane of the assembly depicted in FIG. 4.

Referring to FIGS. 5-5A, an electronic device assembly 300, 300a is depicted that employs or otherwise includes a device assembly 200, 200a comparable to the assembly depicted in FIGS. 4-4A. In particular, the assembly 300, 300a further includes a cover 260 over the plurality of electronic components 180. The cover 260 can have a thickness from about 25 µm to about 125 µm, a first primary surface 264 and a second primary surface 266, and at least one static bend having a radius 265, 265a that is substantially equivalent to the bend radius 140, 140a applied to the backplane 150. With regard to the assembly 300 (see FIG. 5), the cover 260 also includes (a) a first glass layer 260a having an optical transmissivity of at least 90%, a first primary surface 264a and a second primary surface 266a; and (b) a compressive stress region 268 extending from the first primary surface 264a of the first glass layer 260a to a first depth 268a in the first glass layer, the region 268 defined by a compressive stress of at least about 100 MPa at the first primary surface 264a of the first glass layer 260a. With regard to the assembly 300a (see FIG. 5A), the compressive stress region 268b extends from the second primary surface 266a of the first glass layer 260a to a first depth 268c, the region 268b defined by a compressive stress of at least 100 MPa at the second primary surface 266a.

In addition, the cover 260 of the electronic device assembly 300, 300a is also characterized by: (a) a puncture resistance of greater than about 1.5 kgf when the first primary surface 264 of the cover 260 is supported by (i) an approximately 25 µm thick pressure-sensitive adhesive having an elastic modulus of less than about 1 GPa and (ii) an approximately 50 µm thick polyethylene terephthalate layer having an elastic modulus of less than about 10 GPa, and the second primary surface 266 of the cover 260 is loaded with a stainless steel pin having a flat bottom with a 200 µm diameter; and (b) a pencil hardness of greater than or equal to 8H.

As shown in FIGS. 5-5A, the compressive stress region 268, 268b is located in the portion of the cover 260 likely subjected to tensile stresses associated with the static bend at a radius 265, 265a. But it should be understood that the compressive stress region 268, 268b may also be placed in other locations of the cover 260, essentially in any regions expected to experience tensile stresses in the application environment or other areas where high strength levels can benefit the cover (e.g., surfaces exposed to handling from users of the device containing the electronic device assembly 300, 300a).

In certain aspects of the cover 260 employed in the electronic device assembly 300, 300a, the thickness of the cover 260 can range from about 25 µm to about 125 µm. In other aspects, the thickness of the cover 260 can range from about 50 µm to about 100 µm, or about 60 µm to about 80 µm. Other thickness values can be employed within the foregoing ranges for the thickness of the bendable cover 260.

In some embodiments of the cover 260, it contains a single glass layer 260a having a thickness comparable to the thickness of the cover 260. In other aspects, the cover 260 can contain two or more glass layers 260a. Consequently, the thickness of each glass layer 260a can range from about 1 µm to about 125 µm. It should also be understood that the glass cover 260 can include other non-glass layers (e.g., compliant, polymeric layers) in addition to one or more glass layers 260a.

According to an aspect of the disclosure, an electronic device assembly 300, 300a employs a device assembly 200, 200a comparable to the assembly depicted in FIGS. 4-4A. In particular, the assembly 300, 300a further includes a cover 260 over the plurality of electronic components 180. The cover 260 can have a glass composition, and at least one curved feature having a radius 265, 265a that is substantially equivalent to the bend radius 140, 140a applied to the backplane 150. With regard to the assembly 300 (see FIG.

5), the cover 260 is also characterized by: (a) an optical transmissivity of at least 90%; (b) a puncture resistance of greater than about 1.5 kgf when the first primary surface 264 of the cover 260 is supported by (i) an approximately 25 μm thick pressure-sensitive adhesive having an elastic modulus of less than about 1 GPa and (ii) an approximately 50 μm thick polyethylene terephthalate layer having an elastic modulus of less than about 10 GPa, and the second primary surface 266 of the cover 260 is loaded with a stainless steel pin having a flat bottom with a 200 μm diameter; and (c) a pencil hardness of greater than or equal to 8H. For example, in this configuration, the cover 260 can employ a glass element with one or more static bends and/or curved features, as-formed.

With further regard to the glass layer(s) 260a of the cover 260, each glass layer 260a (and the cover 260 when it does not include a glass layer 260a) can be fabricated from alkali-free aluminosilicate, borosilicate, boroaluminosilicate, and silicate glass compositions. Each glass layer 260a can also be fabricated from alkali-containing aluminosilicate, borosilicate, boroaluminosilicate, and silicate glass compositions. In certain aspects, alkaline earth modifiers can be added to any of the foregoing compositions. In one exemplary aspect, glass compositions according to the following are suitable for the glass layer 260a: $SiO_2$ at 64 to 69% (by mol %); $Al_2O_3$ at 5 to 12%; $B_2O_3$ at 8 to 23%; MgO at 0.5 to 2.5%; CaO at 1 to 9%; SrO at 0 to 5%; BaO at 0 to 5%; $SnO_2$ at 0.1 to 0.4%; $ZrO_2$ at 0 to 0.1%; and $Na_2O$ at 0 to 1%. In another exemplary aspect, the following composition is suitable for the glass layer 50a: $SiO_2$ at ~67.4% (by mol %); $Al_2O_3$ at ~12.7%; $B_2O_3$ at ~3.7%; MgO at ~2.4%; CaO at 0%; SrO at 0%; $SnO_2$ at ~0.1%; and $Na_2O$ at ~13.7%. In a further exemplary aspect, the following composition is also suitable for the glass layer 260a: $SiO_2$ at 68.9% (by mol %); $Al_2O_3$ at 10.3%; $Na_2O$ at 15.2%; MgO at 5.4%; and $SnO_2$ at 0.2%. In some aspects, a composition for glass layer 260a is selected with a relatively low elastic modulus (compared to other alternative glasses). Lower elastic modulus in the glass layer 260a can reduce the tensile stress in the layer 260a associated with the development of static bend(s) contained within it. Other criteria can be used to select the composition for glass layer 260a, including but not limited to ease of manufacturing to low thickness levels while minimizing the incorporation of flaws, ease of development of a compressive stress region to offset tensile stresses generated during bending, optical transparency, and corrosion resistance.

Still referring to FIGS. 5 and 5A, the cover 260 of the electronic device assembly 300 further includes a compressive stress region 268 that extends from the first primary surface 264a of the glass layer 260a to a first depth 268a in the glass layer 260a. Further, the cover 260 of the electronic device assembly 300a further includes a compressive stress region 268b that extends from the second primary surface 266a of the glass layer 260a to a first depth 268c in the glass layer 260a. Among other advantages, the compressive stress region 268, 268b can be employed within the glass layer 260a to offset tensile stresses generated in the glass layer 260a upon the development of one or more static bends, particularly tensile stresses that reach a maximum near the primary surfaces 264a, 266a. The compressive stress region 268, 268b can include a compressive stress of at least about 100 MPa at the first primary surface 264a or second primary surface 266a of the glass layer 260a. In some aspects, the compressive stress at the first primary surface 264a or second primary surface 266a is from about 600 MPa to about 1000 MPa. In other aspects, the compressive stress can exceed 1000 MPa at the first primary surface 264a or second primary surface 266a, up to 2000 MPa, depending on the process employed to produce the compressive stress in the glass layer 260a. For example, the compressive stress region 268, 268b may be formed by an ion-exchange process or by laminating together materials having different coefficients of thermal expansion (including different glass materials). The compressive stress can also range from about 100 MPa to about 600 MPa at the first or second primary surface 264a, 266a in other aspects of this disclosure.

Within the compressive stress region 268, 268b, the compressive stress can stay constant, decrease or increase within the glass layer 260a as a function of depth from the first or second primary surface of the glass layer 264a, 266a down to the first depth 268a, 268c. As such, various compressive stress profiles can be employed in compressive stress region 268, 268b. Further, the depth 268a, 268c can be set at approximately 15 μm or less from the first or second primary surface of the glass layer 264a, 266a. In other aspects, the depth 268a, 268c can be set such that it is approximately ⅓ of the thickness of the glass layer 260a or less, or 20% of the thickness of the glass layer 260a or less, from the first or second primary surface of the glass layer 264a, 266a.

Referring to FIGS. 5 and 5A, the cover 260 is characterized by an absence of failure with one or more static bends at the bend radius 265, 265a from about 5 mm to about 25 mm at about 25° C. and about 50% relative humidity. In some aspects, the bend radius 265, 265a of each static bend within the cover 260 can be set between about 5 mm and about 15 mm. It is also feasible to set the bend radius 265, 265a for each static bend to values within about 25 mm and about 5 mm, depending on the needs of the application. As used herein, the terms "fail," "failure" and the like refer to breakage, destruction, delamination, crack propagation or other mechanisms that leave the stack assemblies, glass articles, glass elements and device assemblies of this disclosure unsuitable for their intended purpose. When the cover 260 contains one or more static bends having a bend radius 265 (see FIG. 5) under these conditions (i.e., at about 25° C. and about 50% relative humidity), tensile stresses are generated at the first primary surface 264 of the cover 260 and compressive stresses are generated at the second primary surface 266. Similarly, when the cover 260 contains one or more static bends having a bend radius 265a (see FIG. 5A) under these conditions, tensile stresses are generated at the second primary surface 266 of the cover 260 and compressive stresses are generated at the first primary surface 264. It should also be understood that bend testing results can vary under testing conditions with temperatures and/or humidity levels that differ from the foregoing. For example, a cover 260 having a static bend with a smaller bend radii 265 (e.g., <5 mm) may be characterized by an absence of failure in bend testing conducted at humidity levels significantly below 50% relative humidity.

The cover 260 is also characterized by a puncture resistance of greater than about 1.5 kgf when the first primary surface 264 of the element 260 is supported by (i) an approximately 25 μm thick pressure-sensitive adhesive ("PSA") having an elastic modulus of less than about 1 GPa and (ii) an approximately 50 μm thick polyethylene terephthalate layer ("PET") having an elastic modulus of less than about 10 GPa, and the second primary surface 266 of the cover 260 is loaded with a stainless steel pin having a flat bottom with a 200 μm diameter (e.g., to simulate impacts to the cover 260 during use of the electronic device assembly 300, 300a in the application environment). Typically, puncture testing according to aspects of this disclosure is performed under displacement control at 0.5 mm/min cross-head speed. In certain aspects, the stainless steel pin is replaced with a new pin after a specified quantity of tests (e.g., 10 tests) to avoid bias that could result from deformation of the metal pin associated with the testing of materials possessing a higher elastic modulus (e.g., a glass cover 260). In some aspects, the cover 260 is characterized by a puncture resistance of greater than about 1.5 kgf at a 5% or greater failure probability within a Weibull plot. The cover 260 can also be characterized by a puncture resistance of greater than about 3 kgf at the Weibull characteristic strength (i.e., a 63.2% or greater). In certain aspects, the cover 260 of the electronic device assembly 300, 300a can resist puncture at about 2 kgf or greater, 2.5 kgf or greater, 3 kgf or greater, 3.5 kgf or greater, 4 kgf or greater, and even higher ranges. The cover 260 is also characterized by a pencil hardness of greater than or equal to 8H.

Referring to FIGS. 5-5A, the cross-sections of electronic device assembly 300, 300a depicted in the figures demonstrate an aspect of the disclosure in which the assembly relies on an ion exchange process to develop a compressive stress region 268, 268b in the cover 260. In some aspects of the assembly 300, the compressive stress region 268, 268b of the cover 260 can be developed through an ion exchange process. That is, the compressive stress region 268, 268b can include a plurality of ion-exchangeable metal ions and a plurality of ion-exchanged metal ions, the ion-exchanged metal ions selected so as to produce compressive stress in the region 268, 268b. In some aspects of electronic device assembly 300, 300a, the ion-exchanged metal ions have an atomic radius larger than the atomic radius of the ion-exchangeable metal ions. The ion-exchangeable ions (e.g., $Na^+$ ions) are present in the cover 260 and the glass layer 260a before being subjected to the ion exchange process. Ion-exchanging ions (e.g., $K^+$ ions) can be incorporated into the cover 260 and one or more layers 260a, replacing some of the ion-exchangeable ions. The incorporation of ion-exchanging ions, for example, $K^+$ ions, into the cover 260 and the layer(s) 260a can be effected by submersing the element or the layer in a molten salt bath containing ion-exchanging ions (e.g., molten $KNO_3$ salt). In this example, the $K^+$ ions have a larger atomic radius than the $Na^+$ ions and tend to generate local compressive stresses in the glass wherever present.

Depending on the ion-exchanging process conditions employed, the ion-exchanging ions can be imparted from the first or second primary surface 264a, 266a down to a first ion exchange depth 268a, 268c, establishing an ion exchange depth-of-layer ("DOL") for the compressive stress region 268, 268b. Compressive stress levels within the DOL that far exceed 100 MPa can be achieved with such ion exchange processes, up to as high as 2000 MPa. As noted earlier, the compressive stress levels in the compressive stress region 268, 268b can serve to offset the tensile stresses in the cover 260 and one or more glass layers 260a that are generated from the presence of one or more static bends having a radius 265, 265a.

Other processing-related information and alternative configurations for the cover 260 elements according to this disclosure can be obtained from the aspects of the stack assemblies and related articles taught in U.S. Provisional Patent Application Nos. 61/932,924 and 61/974,732 (collectively, the "'924 and '732 applications"), filed on Jan. 29, 2014 and Apr. 3, 2014, respectively. For example, the electronic device assemblies 300, 300a can employ various glass compositions, including alkali-containing compositions, within the cover 260 since the cover 260 is not in direct contact with electronic components 180. In some other aspects of the device assemblies 300, 300a, the cover 260 can employ integrated electronic components (e.g., touch sensors) above the backplane 150 and the electronic components 180 mounted to the backplane. In such aspects, the cover 260 will preferably employ an alkali-free glass composition.

In some aspects of the electronic device assembly 300, 300a depicted in FIGS. 5-5A, the assembly further includes an encapsulant 250 beneath the cover 260 and joined to the backplane 150. The encapsulant 250 is configured to encapsulate the electronic components 180. The encapsulant can, in some aspects, be configured as an optically transparent polymeric sealing material. It should be understood, however, that the encapsulant 250 must have suitable mechanical integrity to function as an encapsulant without failure when the assembly 300, 300a includes one or more static bends having a radius 265, 265a. Accordingly, the encapsulant can possess one or more static bend having a radius 255, 255a that is substantially equivalent to the radius 265, 265a of the cover 260.

Referring again to FIGS. 5-5A, another aspect of the electronic device assembly 300, 300a employs an encapsulant 250 in the form of a glass layer having a thickness from about 25 μm to about 125 μm that further includes: (a) a second glass layer 250a having an optical transmissivity of at least 90%, a first primary surface 254a and a second primary surface 256a; and (b) a compressive stress region 258, 258b extending from the first primary surface 254a or second primary surface 256a, respectively, of the second glass layer 250a to a first depth 258a, 258c in the second glass layer 250a, the region 258, 258b defined by a compressive stress of at least about 100 MPa at the first or second primary surface 254a, 256a, respectively, of the second glass layer. The encapsulant 250 is further characterized by an absence of failure when the encapsulant includes one or more static bends and/or curved features having a radius 255, 255a that is substantially equivalent to the static bends present in the backplane 150 at about 25° C. and about 50% relative humidity. As such, the encapsulant 250 can be configured identically or similar to the glass cover 260 described in the foregoing sections.

For some aspects of the electronic device assemblies 300, 300a, the puncture resistance and pencil hardness requirements specified in connection with the cover 260 are not controlling with regard to the encapsulant 250. That is, the encapsulant 250 is not likely subject to direct handling by manufacturing personnel or device owners, thus reducing the importance of high puncture resistance and pencil hardness. In certain other aspects of the disclosure, the encapsulant 250 can include a glass composition substantially free of alkali ions, as discussed above in connection with the backplane 150. These aspects of the assemblies 300, 300a generally require close contact between the encapsulant 250 and the underlying electronic components 180. Although not specifically shown in FIGS. 5 and 5A, the encapsulant 250 will be sealed in practice to the backplane to create a hermetic environment for the electronic components 180. The encapsulant 250 may be sealed to the backplane 150 by frit sealing, as is known in the art.

In certain implementations of the electronic device assemblies 300, 300a, the assembly has a total thickness of 400 microns or less, 375 microns or less, 350 microns or less, 325 microns or less, 300 microns or less, 275 microns or less, 250 microns or less, 225 microns or less, or 200 microns or less. The total thickness of the electronic device assembly generally depends on the respective thicknesses of the backplane 150, encapsulant 250, cover 260 and protect layer 170. For aspects of the device assemblies 300, 300a employing a protect layer 170 constituting a polymeric film and adhesive, the total thickness could be about 600 microns or less. As outlined earlier, the thickness of the backplane can depend on the degree of the processing conditions associated with the prior material removal.

According to an additional aspect, a method of forming an electronic device assembly 300, 300a (see FIGS. 5-5A) is provided that includes the steps: forming a backplane 150 having a glass composition substantially free of alkali ions, an elastic modulus of about 40 GPa to about 100 GPa, an initial thickness that is at least 20 µm greater than a final thickness 152, a first primary surface 154, and a second primary surface 156; removing material from the initial thickness (not shown) of the backplane 150 to define the final thickness 152, the final thickness 1542 from about 20 µm to about 100 µm. The method also includes the steps: forming a protect layer 170 on the first primary surface 154 of the backplane 150; disposing a plurality of electronic components 180 on the second primary surface 156 of the backplane 150; and forming at least one static bend in the backplane 150 after the step of disposing the plurality of electronic components 180 on the second primary surface 156 of the backplane 150, the static bend having a bend radius 140 between about 25 mm and about 5 mm.

In certain aspects of the method of forming the electronic device assembly 300, 300a, the method can further include the step: forming a cover 260 over the plurality of electronic components 180, the cover 260 having a thickness from about 25 µm to about 125 µm, a first primary surface 264, a second primary surface 266. The cover 260 also includes a first glass layer 260a having an optical transmissivity of at least 90%; a first primary surface 264a; and a second primary surface 266a. The cover 260 of the assembly 300 also includes a compressive stress region 268 extending from the first primary surface 264a of the first glass layer 260a to a first depth 268a in the first glass layer, the region 268 defined by a compressive stress of at least about 100 MPa at the first primary surface 264a of the first glass layer 260a. The cover 260 of the assembly 300a also includes a compressive stress region 268b extending from the second primary surface 266a of the first glass layer 260a to a first depth 268c in the first glass layer, the region 268b defined by a compressive stress of at least about 100 MPa at the second primary surface 264a of the first glass layer 260a.

The cover 260 of the assembly 300, 300a formed according to the foregoing method is also characterized by a puncture resistance of greater than about 1.5 kgf when the first primary surface 264 of the cover 260 is supported by (i) an approximately 25 µm thick pressure-sensitive adhesive having an elastic modulus of less than about 1 GPa and (ii) an approximately 50 µm thick polyethylene terephthalate layer having an elastic modulus of less than about 10 GPa, and the second primary surface 266 of the cover 260 is loaded with a stainless steel pin having a flat bottom with a 200 µm diameter; and a pencil hardness of greater than or equal to 8H. The method of forming the assembly 300, 300a also includes the step of bending the cover 260 to form at least one static bend or curved feature having a radius 265 substantially equivalent to the bend radius 140 of the one or more static bends in the backplane 150.

In certain aspects of the method of forming the electronic device assembly 300, 300a, the method includes the steps: sealing the backplane 150 with an encapsulant 250; and encapsulating the plurality of electronic components 180 with the encapsulant 250. According to some embodiments, the encapsulant 250 includes a thickness from about 25 µm to about 125 µm; a second glass layer 250a having an optical transmissivity of at least 90%; and a first primary surface 254. Further, the encapsulant 250 of the assembly 300 formed according to the foregoing method includes a compressive stress region 258 extending from the first primary surface 254a of the second glass layer 250a to a first depth 258a in the second glass layer, the region 258 defined by a compressive stress of at least about 100 MPa at the first primary surface 254s of the second glass layer 250a. Similarly, the encapsulant 250 of the assembly 300a formed according to the foregoing method includes a compressive stress region 258b extending from the second primary surface 256a of the second glass layer 250a to a first depth 258c in the second glass layer, the region 258b defined by a compressive stress of at least about 100 MPa at the second primary surface 256a of the second glass layer 250a. In addition, the encapsulant 250 of the assembly 300, 300a also includes at least one curved feature or static bend having a radius 255, 255a substantially equivalent to the bend radius 140 of the backplane 150. Certain aspects of the method outlined in this disclosure require a step of bending the encapsulant 250 to form the at least one static bend or curved feature before the step of sealing the encapsulant 250 to the backplane 150. In another aspect of the foregoing method, the sealing step includes a step of frit sealing the encapsulant 250 to the backplane 150.

It will be apparent to those skilled in the art that various modifications and variations can be made without departing from the spirit and scope of the claims. For example, the stack assembly 100, 100a depicted in FIGS. 2-2C includes a protect layer 70 on the primary surface 254, expected to be in tension from the presence of one or more static bends having a radius 40, 40a. Yet other variants are possible in which the protect layer 70 is employed on additional surfaces and/or edges of the glass element 50 (not shown) employed in the stack assembly 100, 100a expected to experience tensile stresses from the presence of one or more static bends and/or curved features.

By way of additional example, the various layers of the stack assembly may be formed out of bendable glass layers that are formed into the desired non-planar shape when being placed into the stack, or glass layers that are set in the desired non-planar shape (e.g. slumped or otherwise formed into a non-planar shape so that they are normally in such a non-planar configuration) prior to assembly into the stack. The latter is particularly true of the encapsulant layer and cover, which may not need to be processed in a planar manner prior to being assembled into the stack.

The various aspects described in the specification may be combined in any and all combinations. For example, the aspects may be combined as set forth below.

According to a first aspect, there is provided an electronic device assembly, comprising:
 a backplane having a glass composition substantially free of alkali ions,
  an elastic modulus of about 40 GPa to about 100 GPa,
  a final thickness from about 20 µm to about 100 µm,
  a first primary surface, and
  a second primary surface, the primary surfaces characterized by a prior material removal to the final thickness from an initial thickness that is at least 20 µm greater than the final thickness;
 a protect layer on the first primary surface of the backplane; and a plurality of electronic components on the second primary surface of the backplane, wherein the backplane is configured with at least one static bend having a bend radius between about 25 mm and about 5 mm.

According to a second aspect, there is provided the electronic device assembly according to aspect 1, wherein the static bend has a bend radius between about 15 mm and about 5 mm.

According to a third aspect, there is provided the electronic device assembly according to aspect 1 or aspect 2, wherein the protect layer comprises nano-silica particulate and at least one of epoxy and urethane materials.

According to a fourth aspect, there is provided the electronic device assembly according to any one of aspects 1-3, wherein the composition of the backplane has less than 0.5 mol % of each of $Li_2O$, $Na_2O$, $K_2O$, $Rb_2O$ and $Cs_2O$.

According to a fifth aspect, there is provided the electronic device assembly according to any one of aspects 1-4, wherein the electronic components comprise at least one thin film transistor element.

According to a sixth aspect, there is provided the electronic device assembly according to any one of aspects 1-4, wherein the electronic components comprise at least one OLED element.

According to a seventh aspect, there is provided the electronic device assembly according to any one of aspects 1-6, further comprising:

a cover over the plurality of electronic components, the cover having a thickness from about 25 μm to about 125 μm, a first primary surface, a second primary surface, at least one static bend having a radius substantially equivalent to the bend radius, and further comprising:

(a) a first glass layer having an optical transmissivity of at least 90%, and a first primary surface; and (b) a compressive stress region extending from the first primary surface of the first glass layer to a first depth in the first glass layer, the region defined by a compressive stress of at least about 100 MPa at the first primary surface of the first glass layer, wherein the cover is characterized by:

(a) a puncture resistance of greater than about 1.5 kgf when the first primary surface of the cover is supported by (i) an approximately 25 μm thick pressure-sensitive adhesive having an elastic modulus of less than about 1 GPa and (ii) an approximately 50 μm thick polyethylene terephthalate layer having an elastic modulus of less than about 10 GPa, and the second primary surface of the cover is loaded with a stainless steel pin having a flat bottom with a 200 μm diameter; and (a) a pencil hardness of greater than or equal to 8H.

According to an eighth aspect, there is provided the electronic device assembly according to aspect 7, wherein the electronic device assembly has a total thickness of 250 μm or less.

According to a ninth aspect, there is provided the electronic device assembly according to any one of aspects 1-6, further comprising:

a cover over the plurality of electronic components, the cover having a glass composition, and at least one curved feature having a radius substantially equivalent to the bend radius, wherein the cover is further characterized by:

(a) an optical transmissivity of at least 90%;

(b) a puncture resistance of greater than about 1.5 kgf when the first primary surface of the cover is supported by (i) an approximately 25 μm thick pressure-sensitive adhesive having an elastic modulus of less than about 1 GPa and (ii) an approximately 50 μm thick polyethylene terephthalate layer having an elastic modulus of less than about 10 GPa, and the second primary surface of the cover is loaded with a stainless steel pin having a flat bottom with a 200 μm diameter; and (c) a pencil hardness of greater than or equal to 8H.

According to a tenth aspect, there is provided the electronic device assembly according to aspect 7 or aspect 9, further comprising an encapsulant located beneath the cover and joined to the backplane, the encapsulant configured to encapsulate the plurality of electronic components.

According to an eleventh aspect, there is provided the electronic device assembly according to aspect 7 or aspect 9, further comprising:

an encapsulant located beneath the cover and joined to the backplane, the encapsulant configured to encapsulate the plurality of electronic components, wherein the encapsulant has a thickness from about 25 μm to about 125 μm and further comprises:

(a) a second glass layer having an optical transmissivity of at least 90%, and a first primary surface; and (b) a compressive stress region extending from the first primary surface of the second glass layer to a first depth in the second glass layer, the region defined by a compressive stress of at least about 100 MPa at the first primary surface of the second glass layer, wherein the encapsulant is further characterized by at least one curved feature having a radius substantially equivalent to the bend radius.

According to a twelfth aspect, there is provided the electronic device assembly according to aspect 11, wherein the second glass layer has a glass composition substantially free of alkali ions.

According to a thirteenth aspect, there is provided the electronic device assembly according to aspect 11 or aspect 12, wherein the electronic device assembly has a total thickness of about 375 μm or less.

According to a fourteenth aspect, there is provided a method of forming an electronic device assembly, comprising the steps:

forming a backplane having a glass composition substantially free of alkali ions, an elastic modulus of about 40 GPa to about 100 GPa, an initial thickness that is at least 20 μm greater than a final thickness, a first primary surface, and a second primary surface;

removing material from the initial thickness of the backplane to define the final thickness, the final thickness from about 20 μm to about 100 μm;

forming a protect layer on the first primary surface of the backplane;

disposing a plurality of electronic components on the second primary surface of the backplane; and forming at least one static bend in the backplane after the step of disposing the plurality of electronic components on the second primary surface of the backplane, the static bend having a bend radius between about 25 mm and about 5 mm.

According to a fifteenth aspect, there is provided the method according to aspect 14, wherein the static bend has a bend radius between about 15 mm and about 5 mm.

According to a sixteenth aspect, there is provided the method according to aspect 14 or aspect 15, wherein the protect layer comprises nano-silica particulate and at least one of epoxy and urethane materials.

According to a seventeenth aspect, there is provided the method according to any one of aspects 14-16, wherein the composition of the backplane has less than 0.5 mol % of each of $Li_2O$, $Na_2O$, $K_2O$, $Rb_2O$ and $Cs_2O$.

According to an eighteenth aspect, there is provided the method according to any one of aspects 14-17, wherein the electronic components comprise at least one thin film transistor element.

According to a nineteenth aspect, there is provided the method according to any one of aspects 14-18, wherein the electronic components comprise at least one OLED element.

According to a twentieth aspect, there is provided the method according to any one of aspects 14-19, further comprising the steps:

forming a cover over the plurality of electronic components, the cover having a thickness from about 25 μm to about 125 μm, a first primary surface, a second primary surface, at least one static bend having a radius substantially equivalent to the bend radius of the static bend in the backplane, and further comprising:
(a) a first glass layer having an optical transmissivity of at least 90%;
(b) a first primary surface; and
(c) a compressive stress region extending from the first primary surface of the first glass layer to a first depth in the first glass layer, the region defined by a compressive stress of at least about 100 MPa at the first primary surface of the first glass layer,
wherein the cover is characterized by:
(a) a puncture resistance of greater than about 1.5 kgf when the second primary surface of the cover is supported by (i) an approximately 25 μm thick pressure-sensitive adhesive having an elastic modulus of less than about 1 GPa and (ii) an approximately 50 μm thick polyethylene terephthalate layer having an elastic modulus of less than about 10 GPa, and the first primary surface of the cover is loaded with a stainless steel pin having a flat bottom with a 200 μm diameter; and
(b) a pencil hardness of greater than or equal to 8H; and
bending the cover to form at least one static bend having a radius substantially equivalent to the bend radius of the static bend in the backplane.

According to a twenty first aspect, there is provided the method according to aspect 20, wherein the electronic device assembly has a total thickness of 250 μm or less.

According to a twenty second aspect, there is provided the method according to aspect 20, further comprising the steps:
sealing the backplane with an encapsulant; and
encapsulating the plurality of electronic components with the encapsulant.

According to a twenty third aspect, there is provided the method according to aspect 22, wherein the encapsulant comprises:
(a) a thickness from about 25 μm to about 125 μm;
(b) a second glass layer having an optical transmissivity of at least 90%,
(c) a first primary surface;
(d) a compressive stress region extending from the first primary surface of the second glass layer to a first depth in the second glass layer, the region defined by a compressive stress of at least about 100 MPa at the first primary surface of the second glass layer; and
(e) at least one curved feature having a radius substantially equivalent to the bend radius of the static bend in the backplane.

According to a twenty fourth aspect, there is provided the method according to aspect 22 or aspect 23, wherein the second glass layer has a glass composition substantially free of alkali ions.

According to a twenty fifth aspect, there is provided the method according to aspect 22, further comprising the step:
bending the encapsulant to form the at least one curved feature before the step of sealing the encapsulant to the backplane.

According to a twenty sixth aspect, there is provided the method according to aspect 22, wherein the electronic device assembly has a total thickness of about 375 μm or less.

According to a twenty seventh aspect, there is provided the method according to any one of aspects 23-26, wherein the sealing step comprises frit sealing the encapsulant to the backplane.

What is claimed is:
1. An electronic device assembly, comprising:
a backplane having a glass composition substantially free of alkali ions,
an elastic modulus of about 40 GPa to about 100 GPa,
a final thickness from about 20 μm to about 100 μm,
a first primary surface, and
a second primary surface, the primary surfaces characterized by a prior material removal to the final thickness from an initial thickness that is at least 20 μm greater than the final thickness;
a protect layer on the first primary surface of the backplane; and
a plurality of electronic components on the second primary surface of the backplane,
wherein the backplane is configured with at least one static bend having a bend radius between about 25 mm and about 5 mm, and further comprising:
a cover over the plurality of electronic components, the cover having a glass composition, and at least one curved feature having a radius substantially equivalent to the bend radius,
wherein the cover is further characterized by:
(a) an optical transmissivity of at least 90%;
(b) a puncture resistance of greater than about 1.5 kgf when a first primary surface of the cover is supported by (i) an approximately 25 μm thick pressure-sensitive adhesive having an elastic modulus of less than about 1 GPa and (ii) an approximately 50 μm thick polyethylene terephthalate layer having an elastic modulus of less than about 10 GPa, and a second primary surface of the cover is loaded with a stainless steel pin having a flat bottom with a 200 μm diameter; and
(c) a pencil hardness of greater than or equal to 8H.

2. The electronic device assembly according to claim 1, wherein the protect layer comprises nano-silica particulate and at least one of epoxy and urethane materials.

3. The electronic device assembly according to claim 1, wherein the composition of the backplane has less than 0.5 mol % of each of $Li_2O$, $Na_2O$, $K_2O$, $Rb_2O$ and $Cs_2O$.

4. The electronic device assembly according to claim 1, wherein the electronic components comprise at least one thin film transistor element or at least one OLED element.

5. The electronic device assembly according to claim 1, the cover having a thickness from about 25 μm to about 125 μm, and further comprising:
a compressive stress region extending from the first primary surface of the cover to a first depth in the cover, the region defined by a compressive stress of at least about 100 MPa at the first primary surface of the cover.

6. The electronic device assembly according to claim 5, wherein the electronic device assembly has a total thickness of 250 μm or less.

7. The electronic device assembly according to claim 1, further comprising:
an encapsulant located beneath the cover and joined to the backplane, the encapsulant configured to encapsulate the plurality of electronic components.

8. The electronic device assembly according to claim 1, further comprising:
an encapsulant located beneath the cover and joined to the backplane, the encapsulant configured to encapsulate the plurality of electronic components, wherein the encapsulant has a thickness from about 25 μm to about 125 μm and further comprises:
  (a) a glass layer having an optical transmissivity of at least 90%, and a first primary surface; and
  (b) a compressive stress region extending from the first primary surface of the glass layer to a first depth in the glass layer, the region defined by a compressive stress of at least about 100 MPa at the first primary surface of the glass layer,
  wherein the encapsulant is further characterized by at least one curved feature having a radius substantially equivalent to the bend radius.

9. The electronic device assembly according to claim 8, wherein the glass layer has a glass composition substantially free of alkali ions.

10. The electronic device assembly according to claim 8, wherein the electronic device assembly has a total thickness of about 375 μm or less.

11. The electronic device assembly according to claim 1, wherein the backplane further comprises at least one edge disposed between the first and second primary surfaces, and wherein the protect layer is disposed on the at least one edge.

12. A method of forming an electronic device assembly, comprising the steps:
forming a backplane having a glass composition substantially free of alkali ions, an elastic modulus of about 40 GPa to about 100 GPa, an initial thickness that is at least 20 μm greater than a final thickness, a first primary surface, and a second primary surface;
removing material from the initial thickness of the backplane to define the final thickness, the final thickness from about 20 μm to about 100 μm;
forming a protect layer on the first primary surface of the backplane;
after forming the protect layer, disposing a plurality of electronic components on the second primary surface of the backplane;
forming at least one static bend in the backplane after the step of disposing the plurality of electronic components on the second primary surface of the backplane, the static bend having a bend radius between about 25 mm and about 5 mm;
sealing the backplane with an encapsulant; and
encapsulating the plurality of electronic components with the encapsulant, wherein the encapsulant comprises:
  (a) a thickness from about 25 μm to about 125 μm;
  (b) a glass layer having an optical transmissivity of at least 90%,
  (c) a first primary surface;
  (d) a compressive stress region extending from the first primary surface of the glass layer to a first depth in the glass layer, the region defined by a compressive stress of at least about 100 MPa at the first primary surface of the glass layer; and
  (e) at least one curved feature having a radius substantially equivalent to the bend radius of the static bend in the backplane.

13. The method according to claim 12, wherein the protect layer comprises nano-silica particulate and at least one of epoxy and urethane materials.

14. The method according to claim 12, wherein the composition of the backplane has less than 0.5 mol % of each of $Li_2O$, $Na_2O$, $K_2O$, $Rb_2O$ and $Cs_2O$.

15. The method according to claim 12, wherein the electronic components comprise at least one thin film transistor element or at least one OLED element.

16. The method according to claim 12, wherein the glass layer has a glass composition substantially free of alkali ions.

17. The method according to claim 12, further comprising the step:
bending the encapsulant to form the at least one curved feature before the step of sealing the encapsulant to the backplane.

18. The method according to claim 12, wherein the electronic device assembly has a total thickness of about 375 μm or less.

19. The method according to claim 12, wherein the sealing step comprises frit sealing the encapsulant to the backplane.

* * * * *

UNITED STATES PATENT AND TRADEMARK OFFICE
CERTIFICATE OF CORRECTION

PATENT NO. : 10,483,210 B2  
APPLICATION NO. : 15/523759  
DATED : November 19, 2019  
INVENTOR(S) : Timothy Michael Gross et al.

Page 1 of 1

It is certified that error appears in the above-identified patent and that said Letters Patent is hereby corrected as shown below:

On the Title Page

Page 3, Column 1, item [56], Line 4, delete "Internaitonal" and insert -- International --, therefor.

Page 3, Column 1, item [56], Line 7, delete "Internaitonal" and insert -- International --, therefor.

Signed and Sealed this  
Third Day of March, 2020

Andrei Iancu  
*Director of the United States Patent and Trademark Office*